United States Patent
Kawakawaguchi et al.

[11] Patent Number: 5,989,105
[45] Date of Patent: Nov. 23, 1999

[54] METHOD AND APPARATUS FOR POLISHING CHAMFERS OF SEMICONDUCTOR WAFERS

[75] Inventors: Akira Kawakawaguchi; Shigeru Kimura; Akihito Yanoo; Masao Takada, all of Hyogo-ken; Shoji Tsuruta; Shigeo Kumabe, both of Tokyo, all of Japan

[73] Assignees: Mitsubishi Materials Corporation; Mitsubishi Materials Silicon Corporation, both of Tokyo, Japan

[21] Appl. No.: 08/902,193

[22] Filed: Jul. 29, 1997

[30] Foreign Application Priority Data

| Jul. 29, 1996 | [JP] | Japan | 8-199095 |
| Aug. 6, 1996 | [JP] | Japan | 8-207480 |
| Aug. 6, 1996 | [JP] | Japan | 8-207481 |
| Aug. 6, 1996 | [JP] | Japan | 8-207482 |
| Aug. 6, 1996 | [JP] | Japan | 8-207483 |
| Mar. 11, 1997 | [JP] | Japan | 9-056615 |
| May 2, 1997 | [JP] | Japan | 9-114887 |
| May 2, 1997 | [JP] | Japan | 9-114888 |

[51] Int. Cl.⁶ ............................... B24B 49/00
[52] U.S. Cl. ............... 451/44; 451/36; 451/42; 451/43; 451/57; 451/65; 451/67
[58] Field of Search .................. 451/36, 42, 43, 451/57, 65, 67, 339

[56] References Cited

U.S. PATENT DOCUMENTS

| 5,094,037 | 3/1992 | Hakomori et al. | 451/43 |
| 5,316,620 | 5/1994 | Hasegawa et al. | 451/57 |
| 5,317,836 | 6/1994 | Hasegawa et al. | 451/44 |
| 5,404,678 | 4/1995 | Hasegawa et al. | 451/44 |
| 5,547,415 | 8/1996 | Hasegawa et al. | 451/44 |
| 5,830,045 | 11/1998 | Togawa et al. | 451/67 |

*Primary Examiner*—David A. Scherbel
*Assistant Examiner*—Shantese McDonald
*Attorney, Agent, or Firm*—Oblon, Spivak, McClelland, Maier & Neustadt, P.C.

[57] ABSTRACT

A semiconductor wafer chamfer polishing method for polishing chamfers formed on the edges of semiconductor wafers includes rotating a semiconductor wafer; pressing a polishing cloth against a chamfer of the semiconductor wafer with sufficient pressure to elastically deform the polishing cloth, while supplying polishing fluid to the chamfer; sliding the polishing cloth along an incline of the chamfer from an outer edge toward a center of the semiconductor wafer so as to form a bulge portion of the polishing cloth which contacts an outer surface of the semiconductor wafer, thereby polishing the outer surface along with the chamfer of the semiconductor wafer.

19 Claims, 25 Drawing Sheets

METHOD AND APPARATUS FOR POLISHING CHAMFERS OF SEMICONDUCTOR WAFERS

BACKGROUND OF THE INVENTION

1. Field of the Invention

The present invention relates to a method and apparatus for polishing chamfers of semiconductor wafers, for polishing chamfers formed on the edges of semiconductor wafers.

2. Background Art

As techniques for etching chamfers formed on the edges of semiconductor wafers such as silicon wafers, CCR (Chemical Corner Rounding) processes are known, but CCR leaves projections at the boundaries between the chamfers and the semiconductor wafer surface. Although these projections are tiny, when the semiconductor wafers are stored in resin cassettes, they can scratch the cassettes and leave small shavings. These shavings can result in degradation of the semiconductor performance.

Aside from CCR, a process of CMP (Chemical Mechanical Polishing) of the chamfers of semiconductor wafers is known. CMP is a technique of polishing using a polishing cloth while supplying polishing fluid to the chamfers of semiconductor wafers. In a conventional apparatus for performing CMP, a polishing drum wound with a polishing cloth is rotatably supported such that the axis thereof is inclined with respect to the rotational axis of the semiconductor wafer, and polishing is performed by pressing this polishing drum against the chamfers of semiconductor wafers while under rotation.

However, even if the above-mentioned CMP apparatus is used, as long as the polishing drum is rotated about an axis which is inclined with respect to the rotational axis of the semiconductor wafer, there is a possibility of ridges being formed on the chamfers of the semiconductor wafers due to polishing in the circumferential direction, thus forming chamfers which are not smooth.

SUMMARY OF THE INVENTION

The present invention has been made in view of the above-mentioned problems, and has an object of offering a method and apparatus for polishing the chamfers of semiconductor wafers capable of smoothly shaping the chamfers while increasing the semiconductor wafer processing precision to suppress degradations of the throughput during production and the properties of the semiconductor wafers.

One embodiment of the present invention offers a semiconductor wafer chamfer polishing method for polishing chamfers formed on the edges of semiconductor wafers, including the steps of maintaining a semiconductor wafer in a state of rotation in a circumferential direction thereof; pressing a polishing cloth against a chamfer of the semiconductor wafer with sufficient pressure to elastically deform the polishing cloth while supplying polishing fluid to the chamfer; and sliding the polishing cloth along an incline of the chamfer from an outer edge toward a center of the semiconductor wafer so as to form a bulge portion of the polishing cloth which contacts an outer surface of the semiconductor wafer; thereby polishing the outer surface along with the chamfer of the semiconductor wafer.

Additionally, the present invention offers a semiconductor wafer chamfer polishing apparatus for polishing chamfers formed on the edges of semiconductor wafers, comprising a wafer rotation mechanism for holding a semiconductor wafer and supporting the semiconductor wafer so as to be capable of rotating in a circumferential direction thereof; and a polishing cloth drive mechanism for pressing a polishing cloth against a chamfer of the semiconductor wafer with sufficient pressure to elastically deform the polishing cloth while supplying polishing fluid to the chamfer, and supporting the polishing cloth so as to be capable of sliding along an incline of the chamfer from an outer edge toward a center of the semiconductor wafer.

With the above-described semiconductor wafer chamfer polishing method and apparatus, sliding the polishing cloth along the incline of the chamfers from an outer edge toward the center of the semiconductor wafer allows the direction of movement of the polishing cloth at the point of contact between the polishing cloth and the semiconductor wafer to intersect perpendicularly with the direction of movement of the chamfers of the semiconductor wafer, thus preventing the formation of ridges in the circumferential direction due to polishing.

Furthermore, since the polishing cloth is slid while being elastically deformed by being pressed into contact with the chamfers, a bulge portion is formed where the polishing cloth contacts the outer side surface of the semiconductor wafer, so that the bulge portion is pressed into contact with the outer side surface while sliding from the outer side surface toward the chamfer. That is, as the polishing cloth polishes the chamfers, the outer side surfaces are also simultaneously polished without the formation of ridges in the circumferential direction.

Additionally, in this embodiment of the semiconductor wafer chamfer polishing apparatus, the polishing cloth drive mechanism preferably comprises a rotatably supported polishing drum having an axis parallel to front and reverse surfaces of the semiconductor wafer, and drum drive means for rotating said polishing drum; and said polishing cloth is provided such as to cover an outer circumferential surface of said polishing drum.

In this embodiment, since the polishing cloth drive mechanism is provided with a polishing drum with the outer circumferential surface covered by a polishing cloth, polishing is performed with the direction of rotation of the polishing drum and the direction of movement of the chamfers of the semiconductor wafer intersecting perpendicularly, so that the speed of the polishing cloth sliding on the chamfer surface is adjusted by the rotational speed of the polishing drum.

This embodiment preferably further comprises a wafer conveyance mechanism for conveying semiconductor wafers; a front surface polishing chamber and reverse surface polishing chamber for polishing chamfers on a front surface side and a reverse surface side of each of the semiconductor wafers respectively; a front surface polishing chamber transfer mechanism and a reverse surface polishing chamber transfer mechanism for respectively transferring semiconductor wafers conveyed by said wafer conveyance mechanism to said front surface polishing chamber and said reverse surface polishing chamber, then respectively returning the semiconductor wafers to the wafer conveyance mechanism after the semiconductor wafers have been polished; wherein said wafer conveyance mechanism comprises a front surface side wafer cleansing portion and a reverse surface side wafer cleansing portion which cleanse each of the semiconductor wafers which are transferred from said front surface polishing chamber and said reverse surface polishing chamber by said front surface polishing chamber transfer mechanism and said reverse surface polishing chamber transfer mechanism with cleansing water.

Since this semiconductor wafer chamfer polishing apparatus is provided with a front surface side cleansing portion and reverse surface side wafer cleansing portion separate from the front surface polishing chamber and the reverse surface polishing chamber, the semiconductor wafers with the chamfers on the front surface polished in the front surface polishing chamber can be transferred to the front surface side wafer cleansing portion by means of the front surface polishing chamber transfer mechanism in order to cleanse the polishing fluid adhering during polishing of the front surface side. Furthermore, the semiconductor wafers with the chamfers on the reverse surface polished in the reverse surface polishing chamber can be transferred to the reverse surface side wafer cleansing portion by means of the reverse surface polishing chamber transfer mechanism in order to cleanse the polishing fluid adhering during polishing of the reverse surface side. Consequently, each time polishing on the front surface side and reverse surface side are completed, the semiconductor wafers are immediately cleansed by the front surface side wafer cleansing portion and reverse surface side wafer cleansing portion which are separate from the front surface polishing chamber and the reverse surface polishing chamber, so that portions which do not require polishing will not be polished due to polishing fluid remaining.

Additionally, since the front surface polishing chamber and the reverse surface polishing chamber are provided separately, polishing can be performed separately in both in parallel, while other semiconductors can be cleansed in parallel at the front surface side cleansing portion and the reverse surface side cleansing portion.

Furthermore, since the front surface polishing chamber and the reverse surface polishing chamber are provided separately from the fronts surface side cleansing portion and the reverse surface side cleansing portion, intermixing of the polishing fluid and the cleansing water is rare, and they are easily reused.

Additionally, the wafer conveyance mechanism should preferably comprise wafer flipping means for receiving and flipping semiconductor wafers transferred from said front surface polishing chamber by said front surface polishing chamber transfer mechanism, then delivering the semiconductor wafers to said reverse surface polishing chamber transfer mechanism.

In this embodiment, since the wafer conveyance mechanism has wafer flipping means, the front surface side and reverse surface side of the semiconductor wafers polished in the front surface polishing chamber and the reverse surface polishing chamber are oriented in the same direction by means of the wafer flipping means, so that the front surface side and the reverse surface side can be polished by polishing mechanisms having the same structure.

Additionally, the semiconductor wafer chamfer polishing apparatus should preferably further comprise a polishing chamber for polishing chamfers of the semiconductor wafers; a wafer cleansing portion for cleansing the semiconductor wafers with cleansing water after the semiconductor wafers have been polished in said polishing chamber; a transfer mechanism for withdrawing the semiconductor wafers from said polishing chamber after the semiconductor wafers have been polished and moving the semiconductor wafers above said polishing chamber to transfer the semiconductor wafers to said wafer cleansing portion; and roof plates which are provided from a top portion of said polishing chamber to a top portion of said wafer cleansing portion; wherein said roof plates are designed to become lower in steps from said polishing chamber to said wafer cleansing portion, and have water stored on top surfaces thereof.

Since this semiconductor wafer chamfer polishing apparatus has roof plates from a top potion of a polishing chamber to a top portion of a wafer cleansing portion, polishing fluid adhering to semiconductor wafers withdrawn from the polishing chamber and transferred above the polishing chamber to the wafer cleansing portion drips onto the roof plates. At this time, since the roof plates are designed to become lower in steps from the polishing chamber to the wafer cleansing portion and have water stored on their top surfaces, the polishing fluid drips down into the water on the top surfaces of the roof plates so as not to dry, and flows from the top portion of the polishing chamber to the top portion of the wafer cleansing portion in steps so as to ultimately drain into the wafer cleansing portion.

Additionally, this embodiment should preferably further comprise a polishing drum having said polishing cloth around an outer circumferential surface of a main body wheel which is rotatably supported, for polishing the chamfers by bringing the polishing cloth into contact with the chamfers while rotating; and drum drive means for rotating said polishing drum; wherein said polishing cloth is formed into a cylindrical shape by layering a plurality of annular unit polishing cloths around said main body wheel.

Since this semiconductor wafer chamfer polishing apparatus has polishing cloths formed by a plurality of annular unit polishing cloths which are layered around main body wheels, cylindrical polishing cloths can be easily formed on the polishing drums simply by wrapping a plurality of unit polishing cloths around the main body wheels.

Additionally, the polishing cloths formed by the annular unit polishing cloths do not have seams in the circumferential direction, so that peeling will not occur and damage is less likely to occur to the semiconductor wafers.

Furthermore, the thicknesses of the polishing cloths are determined by the inner diameter and outer diameter of the unit polishing cloths, so that a specified elasticity can be obtained by changing the setting.

Additionally, even if the quality of the surface of a polishing cloth is reduced due to wear, a new polishing cloth surface can be exposed by scraping the surface, thus allowing polishing over longer periods of time.

Furthermore, in this embodiment, the unit polishing cloths are preferably formed from unwoven fabrics wherein the orientations of the fibers are random.

In this embodiment, since the unit polishing cloths are composed of unwoven fabrics and the fibers of the unit polishing cloths are randomly oriented, good polishing characteristics can be obtained whether the outer edges or the front and reverse surfaces near the outer edges of the unit polishing cloths contact the chamfers.

Additionally, annular reinforcement plates having higher rigidities than the polishing cloths for supporting the polishing cloths should preferably be provided on both ends in the axial direction of the polishing cloth.

Since this embodiment is provided with annular reinforcement plates having higher rigidities than the polishing cloths on both ends of each polishing cloth in the axial direction, the unit polishing cloths at both ends in the axial direction of the unit polishing cloth are supported, so as to prevent the unit polishing cloths from spreading in the axial direction and separating so as to fold over.

Furthermore, annular presser plates for pinching the polishing cloths in the axial direction should preferably be provided at both ends in the axial direction of the polishing cloths.

Since this embodiment is provided with annular pressing plates for pinching the polishing cloths in the axial direction at both ends in the axial direction of the polishing cloths, the elasticities of the polishing cloths can be adjusted by contracting them by specific amounts in the axial direction due to pinching of the unit polishing cloths which are elastic bodies by specified pressing forces in the axial direction.

Additionally, the polishing cloths should preferably be such that the outer diameters of the unit polishing cloths at a portion are larger than the outer diameters of the other unit polishing cloths.

Since this embodiment has the outer diameters of the unit polishing cloths in a portion set to be larger than the outer diameters of the other unit polishing cloths so that the portion with the unit polishing cloths having larger outer diameters protrudes farther than the other unit polishing cloths, when the semiconductor wafers have notch portions, the chamfers of the notch portions can be completely polished by bringing the outer edges of the unit polishing cloths having a larger outer diameter into contact with the chamfers of the notch portions.

Additionally, the chamfers around the entire circumference of semiconductors including notch portions can be polished by a single type of polishing drum by polishing the chamfers aside from the notch portions with the other unit polishing cloths.

Additionally, in this embodiment, the drum drive means should preferably be provided with a drum movement mechanism for advancing and retreating said polishing drum along a contact line of a contact portion of the semiconductor wafer with said polishing cloth contacting the circumferential edges of the semiconductor wafer.

Since this embodiment has a drum drive mechanism with drum movement mechanism which advances or retreats the polishing drums along lines of contact with the semiconductor wafer, a specified pressure is applied not only in the radial direction toward the inside of the notch portion, but also in the circumferential direction due to the positions of contact with the polishing drum (notch portions) being capable of being advanced or retreated by specified amounts in the direction of contact by means of the drum movement mechanism, so that the entire insides of the notch portions are polished evenly.

Additionally, the wafer rotation mechanism should preferably be provided with a wafer suction disc which adheres to a top surface of the semiconductor wafer and supports the semiconductor wafer such as to be capable of rotating in a circumferential direction; and said polishing cloth drive mechanism should preferably bring said polishing cloth into contact with a chamfer on a bottom side of the semiconductor wafer, and have a plurality of polishing cloths positioned at equivalent spacings in a circumferential direction of the semiconductor wafer.

With this semiconductor wafer chamfer polishing apparatus, the semiconductor wafers can be held from above by means of the wafer suction discs, and a plurality of polishing cloths on the polishing cloth drive mechanism are provided at equivalent spacings in the circumferential direction of the semiconductor wafers and brought into contact with the chamfers on the bottom sides of the semiconductor wafers, so that the semiconductor wafers are held by a plurality of polishing cloths contacting the chamfers on the bottom surfaces during polishing. That is, since the polishing cloths are each apply pressure to the chamfers, the pressure is balanced because the polishing cloths are positioned at equivalent spacings in the circumferential direction of the semiconductor wafers, so that the radial components of the pressing force are mutually cancelled and only the components of the pressing force on the semiconductor wafers which are applied in the axially upward direction are left. As a result, the pressing force applied to the suction portions of the semiconductor wafer during polishing are applied perpendicularly to the suction surfaces (i.e., in the direction of suction) of the semiconductor wafers, so that the suction forces of the wafer suction discs are maintained and the semiconductor wafers are further pressed in the direction of suction so as to make a reliable hold.

Additionally, since the polishing cloths are provided at equivalent spacings in the circumferential direction of the semiconductor wafers, the chamfers of the semiconductor wafers can be completely polished over the entire circumference without completing a rotation of the semiconductor wafers, by rotating the semiconductor wafers until the chamfers contacting one of the polishing cloths rotates into contact with the next polishing cloth.

In this embodiment, the polishing cloth drive mechanism should preferably comprise a plurality of rotatably supported polishing drums provided with said polishing cloths on outer circumferential surfaces thereof, and a plurality of drum drive means for rotating said polishing drums; wherein at least one of said plurality of polishing drums is oriented such as to have an axis which is tilted with respect to front and reverse surfaces of the semiconductor wafers and skewed with respect to axes of the semiconductor wafers.

Since this semiconductor wafer chamfer polishing apparatus comprises a plurality of drum drive means for rotating the plurality of polishing drums provided with polishing cloths on their outer circumferential surfaces in the same direction with respect to the chamfers, of the friction caused by the sliding of the polishing cloths on the chamfers, the components in the radial direction of the semiconductor wafers are mutually cancelled so that only the components of the frictional forces in the axial direction of the semiconductor wafers is left. As a result, the friction applied to the suction portions of the semiconductor wafers during polishing is also applied perpendicular to the suction surfaces of the semiconductor wafers so that the suction force of the wafer suction discs is maintained.

Furthermore, the polishing cloth drive mechanism should preferably comprise a plurality of rotatably supported polishing drums provided with said polishing cloths on outer circumferential surfaces thereof, and a plurality of drum drive means for rotating said polishing drums; wherein at least one of said plurality of polishing drums is oriented such as to have an axis which is tilted with respect to front and reverse surfaces of the semiconductor wafers and skewed with respect to axes of the semiconductor wafers.

Since this semiconductor wafer chamfer polishing apparatus has at least one of a plurality of polishing drums which is oriented such as to have an axis which is tilted with respect to front and reverse surfaces of the semiconductor wafers and skewed with respect to axes of the semiconductor wafers, the position of contact of the polishing drum on the chamfers of the semiconductor wafers gradually shifts in a vertical direction during the rotation of the semiconductor wafers. Therefore, in comparison to cases wherein polishing drums having axes parallel to the front and reverse surfaces of the semiconductor wafers are used, the polishing area can be widened in the vertical direction even with a relatively small pressing force.

Additionally, it is suitable to provide a polishing drum having said polishing cloth around an outer circumferential surface of a main body wheel which is rotatably supported, for polishing the chamfers by bringing said polishing cloth into contact with the chamfers while rotating; and drum drive means for rotating said polishing drum; wherein said polishing cloth has cut portions which intersect with a circumferential direction formed on an outer circumference thereof.

Since this semiconductor wafer chamfer polishing apparatus has cut portions which intersect with the circumferential direction formed on the outer circumference of the polishing cloth, polishing fluid is caught and held in the cut portions.

Additionally, since the cut portions make the areas around them more elastic, the edges of the semiconductor wafers are more likely to bite into the polishing cloth at and near the cut portions when the polishing drums are rotated, so that the resistance with the chamfers increases and the polishing speed is increased, thereby allowing the polishing time to be shortened.

Additionally, in this embodiment, the polishing cloth should preferably be formed into a cylindrical shape by layering a plurality of annular unit polishing cloths around said main body wheel.

Since this semiconductor wafer chamfer polishing apparatus has polishing cloths formed by layering a plurality of annular unit polishing cloths around the main body wheel, the depths, number and positions of the cut portions can be set separately for each unit polishing cloth, and various polishing capabilities can be obtained by appropriately combining the plurality of unit polishing cloths.

Additionally, when the polishing cloth is attached, a cylindrical polishing cloth can easily be formed on the polishing drum simply by layering a plurality of unit polishing cloths around the wheel main body.

Furthermore, peeling will not occur because there are no seams in the circumferential direction of the polishing cloths composed of the annular unit polishing cloths.

Additionally, the thickness of the polishing cloths can be set by the inner diameter and outer diameter of the unit polishing cloths, so as to obtain a specified elasticity for the polishing cloth overall by changing the settings.

Also, even if the quality of the surface of the polishing cloth is reduced by wear, a new polishing cloth surface can be exposed by scraping away the surface, so that polishing can be performed over a long period of time.

Furthermore, the plurality of unit polishing cloths may respectively have cut portions formed therein; and said polishing cloth should preferably be arranged such that the cut portions of adjacent unit polishing cloths are mutually separated in a circumferential direction.

Since this semiconductor wafer chamfer polishing apparatus has cut portions of adjacent unit polishing cloths in the polishing cloth mutually separated in a circumferential direction, the cut portions of adjacent unit polishing cloths are not continuous in the axial direction of the polishing drum, so that the amount of bite of the semiconductor wafers is restricted and extraneous bite is prevented.

Additionally, the polishing cloth should preferably be arranged such that the plurality of cut portions are positioned at equivalent spacings in a circumferential direction.

With this semiconductor wafer chamfer polishing apparatus, the plurality of cut portions on the polishing cloth are positioned at equivalent spacings along the circumferential direction, so that the polishing ability in the circumferential direction of the polishing cloths is made uniform and uneven wear in the circumferential direction of the polishing cloth is controlled.

PREFERRED EMBODIMENTS OF THE INVENTION

Figure 1:
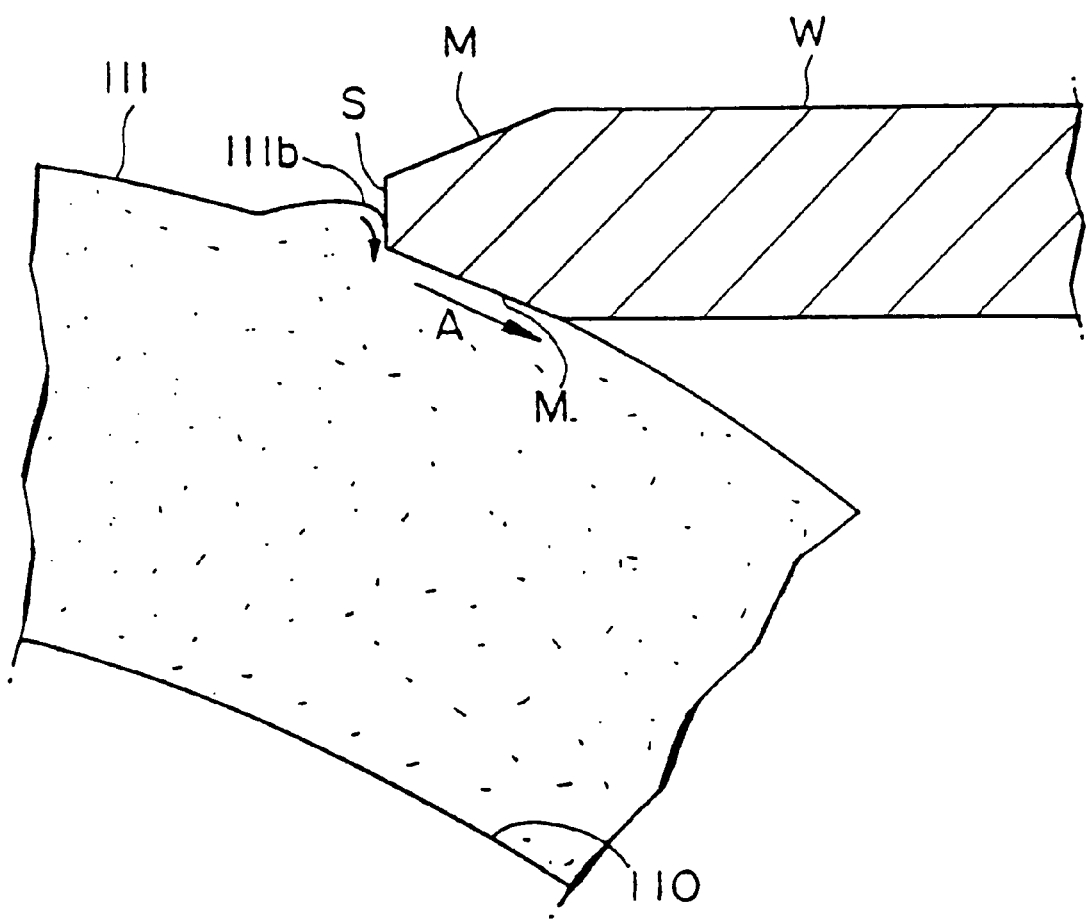
FIG. 1 is an enlarged vertical section view of portions for explaining the polishing of chamfers in a first embodiment of a semiconductor wafer chamfer polishing apparatus according to the present invention.

Hereinbelow, a first embodiment of a method and device for polishing chamfers of semiconductor wafers according to the present invention will be explained with reference to FIGS. 1 through 14.

In these drawings, reference numeral 1 denotes a wafer withdrawal device, reference numeral 2 denotes a wafer positioning unit, reference numeral 3 denotes a wafer conveyor device, reference numeral 4 denotes a front surface polishing chamber, reference numeral 5 denotes a front surface polishing chamber transfer device, reference numeral 6 denotes a reverse surface polishing device, reference numeral 7 denotes a reverse surface polishing device, reference numeral 8 denotes a reverse surface polishing chamber transfer device, reference numeral 9 denotes a reverse surface polishing device and reference numeral 10 denotes a wafer storage device.

Figure 2:
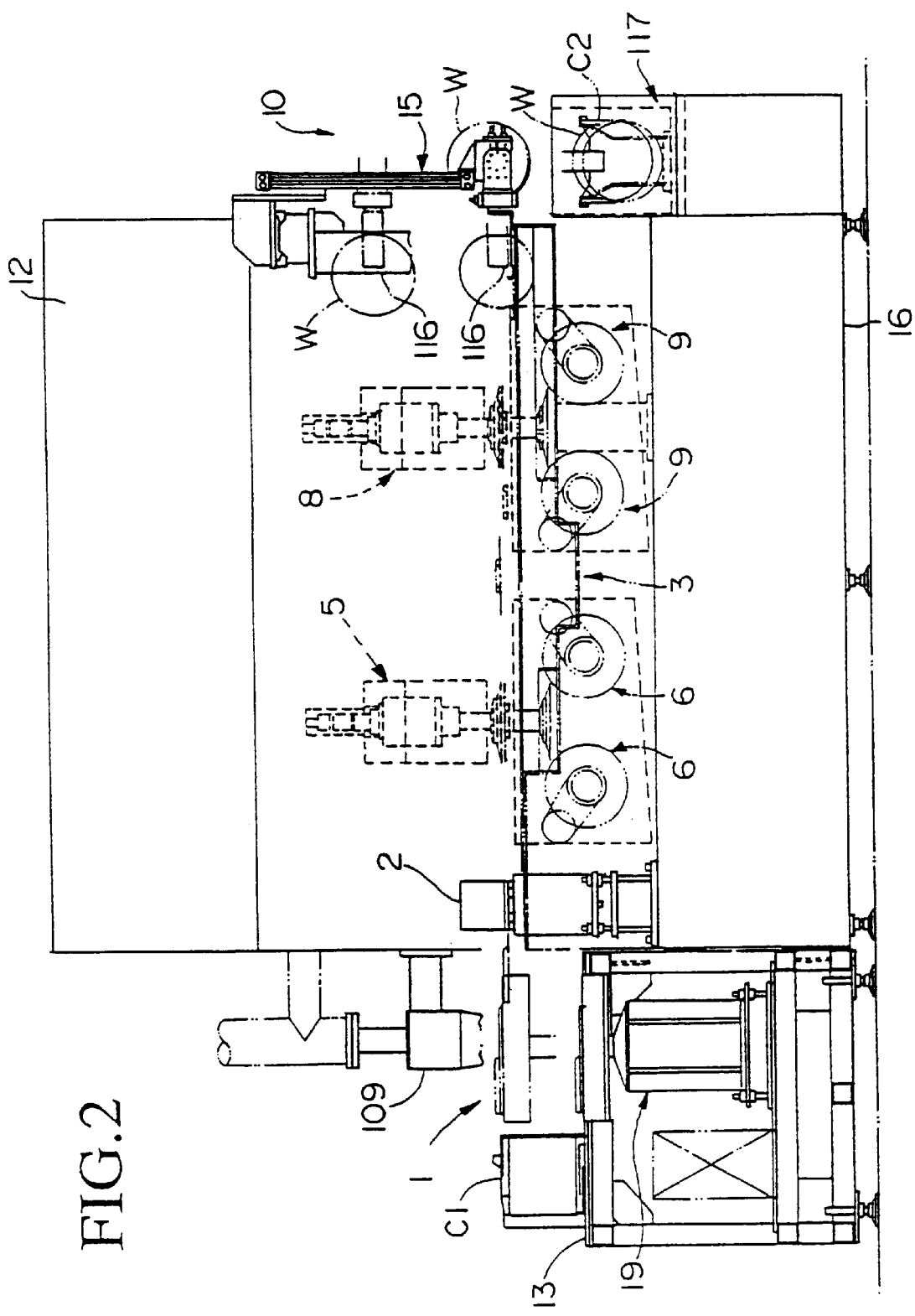
FIG. 2 is front view showing a first embodiment of a semiconductor wafer chamfer polishing apparatus according to the present invention.
Figure 3:
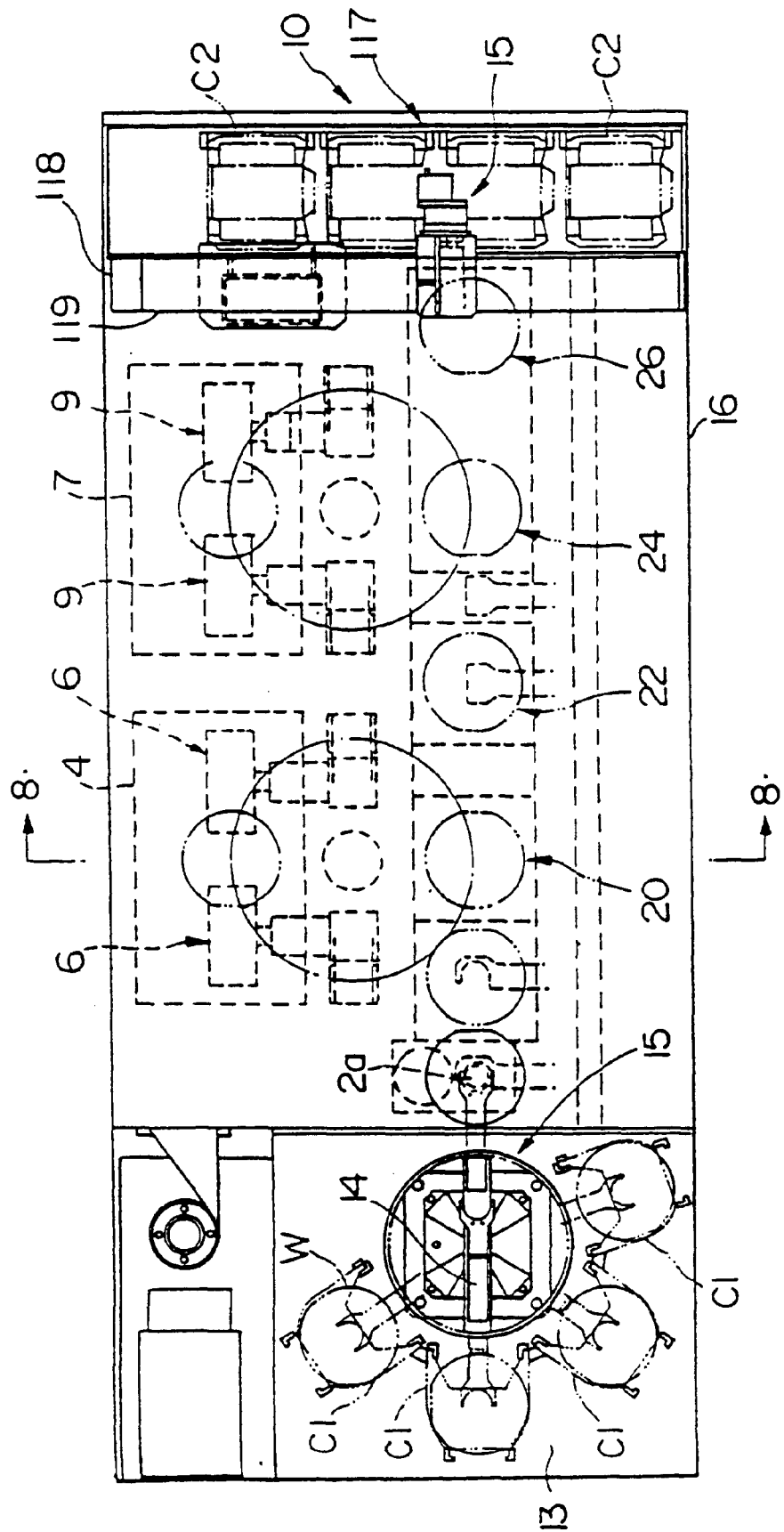
FIG. 3 is a plan view showing a first embodiment of a semiconductor wafer chamfer polishing apparatus according to the present invention.

As shown in FIGS. 2 and 3, the semiconductor wafer chamfer polishing apparatus of the present embodiment comprises a wafer withdrawal device 1 for withdrawing semiconductor wafers W from a cassette C1, a wafer positioning unit 2 for positioning the semiconductor wafers W withdrawn from the wafer withdrawal device 1, a wafer conveyor device 3 for conveying semiconductor wafers W positioned by the wafer positioning unit 2 for polishing of the front surfaces and reverse surfaces of the semiconductor wafers W, a front surface polishing chamber transfer device 5 for transferring the semiconductor wafers W conveyed by the wafer conveyor device 3 to the front surface polishing chamber 4 where the front surfaces of the semiconductor wafers W are polished and returns the semiconductor wafers W to the wafer conveyor device 3 after polishing, a front surface polishing device 6 for polishing the front surfaces of the semiconductor wafers w in the front surface polishing chamber 4, a reverse surface polishing chamber transfer device 8 for transferring the semiconductor wafers W conveyed by the wafer conveyor device 3 to the reverse surface polishing chamber 7 where the reverse surfaces of the semiconductor wafers W are polished and returns the semiconductor wafers W to the wafer conveyor device 3 after polishing, a reverse surface polishing device 9 for polishing the reverse surfaces of the semiconductor wafers W in the reverse surface polishing chamber 7, a wafer storage device 10 for placing the semiconductor wafers W of which the reverse surfaces have been polished and which are conveyed by the wafer conveyor device 3 in a storage cassette C2, and an operation control section 12 which is electrically connected to each of these devices and controls them.

Figure 4:
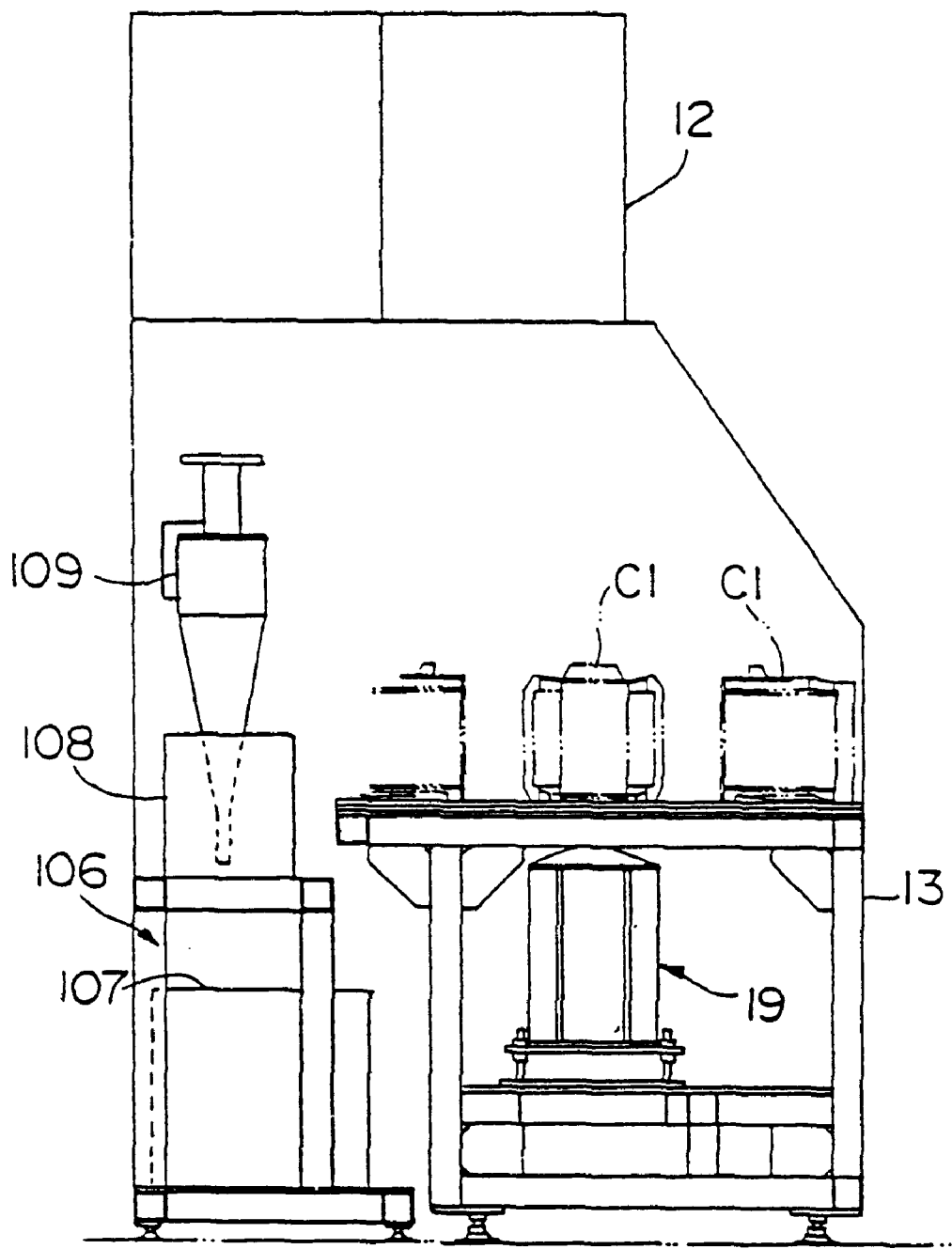
FIG. 4 is a left side view showing a first embodiment of a semiconductor wafer chamfer polishing apparatus according to the present invention.

As shown in FIGS. 2 through 4, the wafer withdrawal device 1 comprises a cassette placement table 13, four cassettes C1 arranged so as to surround the central portion on top of this cassette placement table 13, and a loader unit 15 provided at a central portion of the cassette placement table 13 for withdrawing semiconductor wafers W from a specified cassette C1 one at a time by drawing them up with a withdrawal hand 14.

Each cassette C1 is placed such that the plurality of semiconductor wafers W stored therein have a horizontal orientation, and arranged such that the direction from which the semiconductor wafers W are withdrawn faces toward the central portion of the cassette placement table 13.

Additionally, the loader unit 15 is installed within the cassette placement table 13 with the withdrawal hand 14 which extends in a horizontal direction positioned at above the central portion of the cassette placement table 13. The withdrawal hand 14 is capable of rotating about the vertical axis of the loader unit 15, is capable of extending or retracting, and is supported such as to be capable of moving up and down.

The wafer positioning unit 2 is installed at an end portion of a cassette placement table 13 side of a base 16 which is positioned adjacent to the cassette placement table 13, and centers the semiconductor wafers W withdrawn from the cassette C1 on a placement stand 2a and determines the orientation of the orientation flat.

Figure 5:
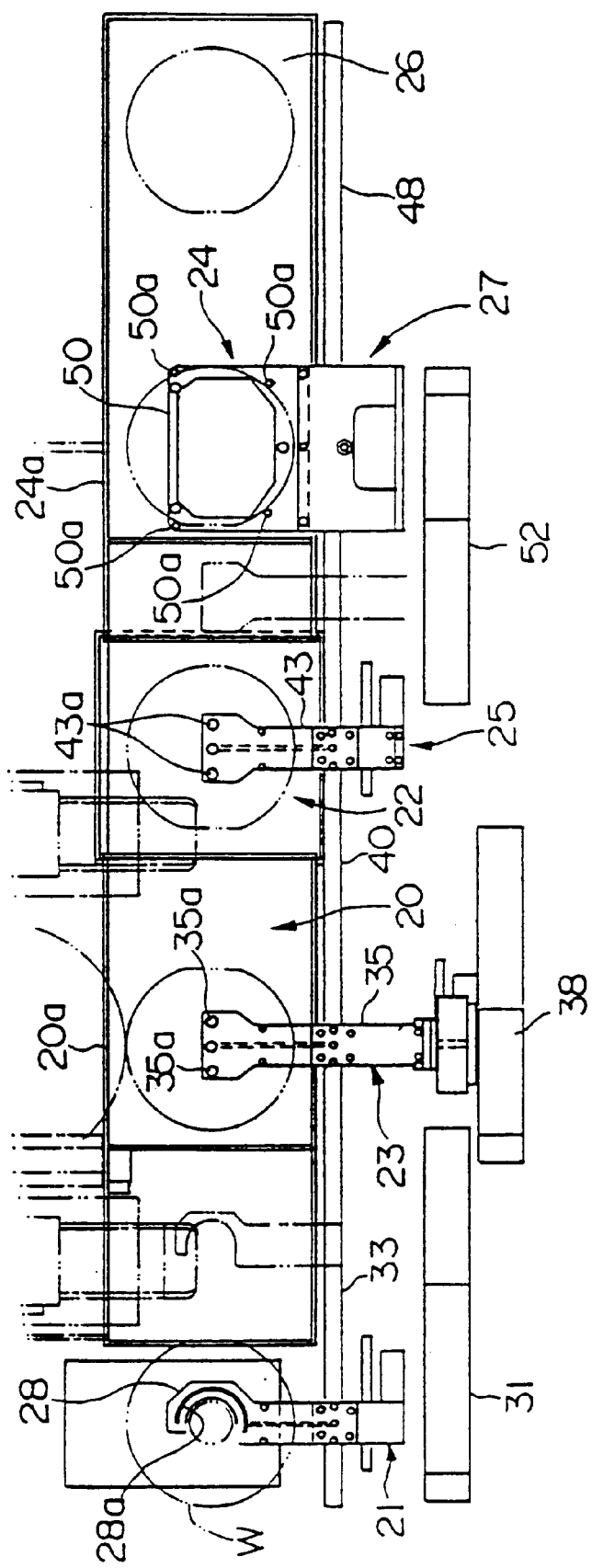
FIG. 5 is a plan view showing a wafer conveyor device of a first embodiment of a semiconductor wafer chamfer polishing apparatus according to the present invention.
Figure 6:
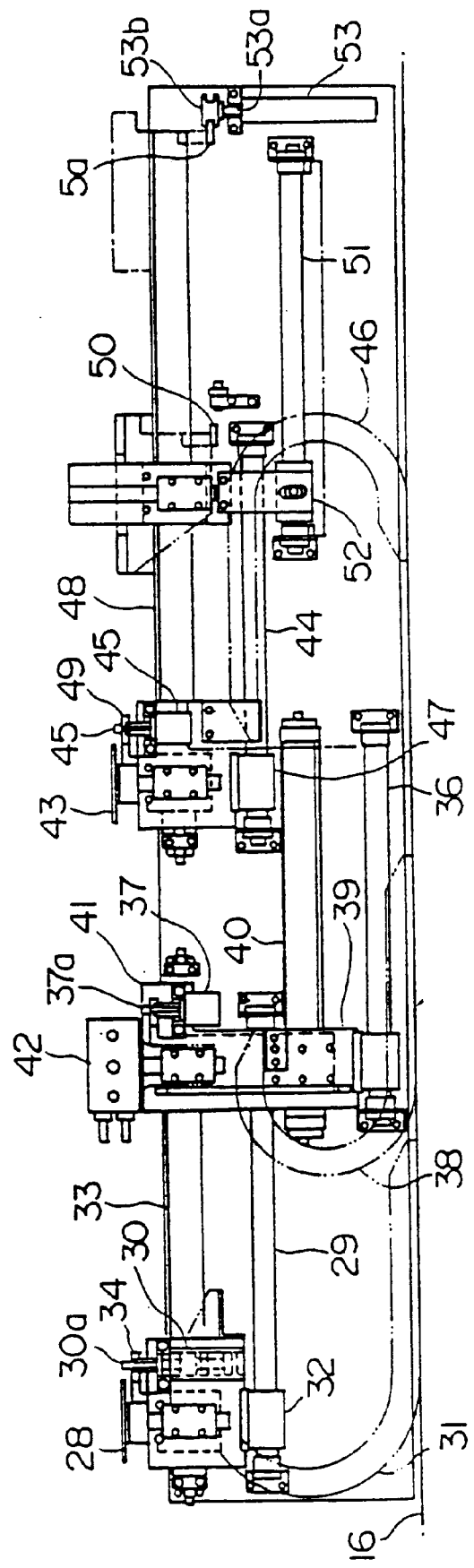
FIG. 6 is a front view showing a wafer conveyor device of a first embodiment of a semiconductor wafer chamfer polishing apparatus according to the present invention.

As shown in FIGS. 5 and 6, the wafer conveyor device 3 comprises a first conveyor section 21 which delivers the semiconductor wafers W positioned by the wafer positioning unit 2 to the front surface polishing chamber transfer device 5 by means of the first delivery section (front surface side wafer cleansing section) 20, a second conveyor section (wafer flipping means) 23 which receives the semiconductor wafers W of which the front surfaces have been polished by means of the front surface polishing device 6 from the front surface polishing chamber transfer device 5 and flips over the semiconductor wafers W at a second delivery section 22, a third conveyor section 25 which receives semiconductor wafers W flipped over by the second conveyor section 23 and delivers them to a reverse surface polishing chamber transfer device 8 by means of a third delivery section (reverse side wafer cleansing section) 24, and a fourth conveyor section 27 which receives semiconductor wafers W of which the reverse sides have been polished by the reverse surface polishing device 9 from the reverse surface polishing chamber transfer device 8 and delivers them to the wafer storage device 10 by means of a fourth delivery section 26.

The first through fourth delivery sections 20, 22, 14 and 26 are arranged in order from the end portion on the cassette placement table 13 side on top of the base 16, and the first through fourth conveyor sections 21, 23, 25 and 27 are provided in order from the end portion of the cassette placement table 13 side along one side of the first through fourth delivery sections 20, 22, 24 and 26.

The first conveyor section 21 comprises a first hand 28 which holds semiconductor wafers W by suction through arcuate suction grooves 28a formed on the end portion, a first rodless cylinder 29 which supports the first hand 28 such as to be capable of horizontally shifting between the loader unit 15 and the first delivery section 20, a first elevator cylinder 30 for supporting the first hand 28 such as to be capable of moving up and down, and a first piping section 31 which bundles pipes for supplying compressed air each connected separately to the suction grooves 28a of the first hand 28, the first rodless cylinder 29, and the first elevator cylinder 30.

The first rodless cylinder 29 has both end portions affixed to one side of the first delivery section 20 in a horizontal orientation, and the base portion of the first hand 28 is supported such as to be capable of moving up and down, and the first elevator cylinder 30 is provided on a first movable portion 32 of the first rodless cylinder 29. Additionally, the first movable section 32 is supported such as to be capable of horizontal movement on the first guide portion 33 which is provided above and parallel to the first rodless cylinder 29.

The first hand 28 extends horizontally in a direction of perpendicular intersection with the longitudinal direction of the base 16, and the base end is connected to the tip end of a piston portion 30a of the first elevator cylinder 30 by means of a coupling member 34.

The second conveyor section 23 comprises a second hand 35 which holds semiconductor wafers W by suction through suction holes 35a formed on the tip portion, a second rodless cylinder 36 which supports the second hand 38 such as to be capable of horizontally shifting between the first delivery section 20 and the second delivery section 22, a second elevator cylinder 37 for supporting the second hand 35 such as to be capable of moving up and down, and a second piping section 38 which bundles pipes for supplying compressed air each connected separately to the suction holes 35a of the second hand 35, the second rodless cylinder 36, and the second elevator cylinder 30.

The second rodless cylinder 36 has the end portions respectively affixed to one side of the first delivery section 20 and the second delivery section 22 in a horizontal orientation, and the base portion of the second hand 35 is supported such as to be capable of moving up and down and rotating, and the second elevator cylinder 30 is provided on a second movable portion 39 of the second rodless cylinder 36. Additionally, the second movable section 39 is supported such as to be capable of horizontal movement on the second guide portion 40 which is provided above and parallel to the second rodless cylinder 36.

The second hand 35 extends horizontally in a direction of perpendicular intersection with the longitudinal direction of the base 16, and the base end is connected to the tip end of a piston portion 37a of the second elevator cylinder 37 by means of a coupling member 41. Additionally, a flipping actuator 42 which supports~the second hand 35 such as to be capable of rotating about an axis in the direction of extension of the second hand 35 is provided on the base end of the second hand 35.

The third conveyor section 25 comprises a third hand 43 which holds semiconductor wafers W by suction through suction holes 43a formed on the tip portion, a third rodless cylinder 44 which supports the third hand 43 such as to be capable of horizontally shifting between the second delivery section 22 and the third delivery section 24, a third elevator cylinder 45 for supporting the third hand 43 such as to be capable of moving up and down, and a third piping section 46 which bundles pipes for supplying compressed air each connected separately to the suction holes 43a of the third hand 43, the third rodless cylinder 44, and the third elevator cylinder 45.

The third rodless cylinder 44 has the end portions respectively affixed to one side of the second delivery section 22 and the third delivery section 24 in a horizontal orientation, and the base portion of the third hand 43 is supported such as to be capable of moving up and down and rotating, and the third elevator cylinder 45 is provided on a third movable portion 47 of the third rodless cylinder 44. Additionally, the third movable section 47 is supported such as to be capable of horizontal movement on the third guide portion 48 which is provided above and parallel to the third rodless cylinder 44.

The third hand 43, as with the second hand 35, extends horizontally in a direction of perpendicular intersection with the longitudinal direction of the base 16, and the base end is connected to the tip end of a piston portion 45a of the third elevator cylinder 45 by means of a coupling member 49.

The fourth conveyor section 27 comprises a fourth hand 50 for placing semiconductor wafers A, and a fourth rodless cylinder 51 for holding the fourth hand 50 so as to be capable of shifting horizontally between the third delivery section 24 and the fourth delivery section 26.

The fourth rodless cylinder 51 has the end portions respectively affixed to one side of the third delivery section 24 and the fourth delivery section 26, and the base end of the fourth hand 50 is supported such as to be capable of moving up and down and rotating on a fourth movable portion 52 of the fourth rodless cylinder 51.

The fourth hand 50 extends horizontally in a direction of perpendicular intersection with the longitudinal direction of the base 16, and the tip end is oriented horizontally at a position lower than the base end.

The tip end of the fourth hand 50 is designed to have the same width as the diameters of the placed semiconductor wafers W, and is provided with four projections 50a for contacting the edge portions of the semiconductor wafers W for positioning.

Additionally, the fourth delivery section 26 is provided with a hand lifting/lowering air cylinder 53 for supporting the fourth hand 50 such as to be capable of being lifted or lowered when moved to the fourth delivery section 26 at the end portion in the longitudinal direction of the base 16. The hand lifting/lowering air cylinder 53 extends in a vertical direction, and a fourth hand support member 53b into which a side portion of the fourth hand 50 is inserted is attached to the tip portion of the cylinder rod 53a.

Figure 7:
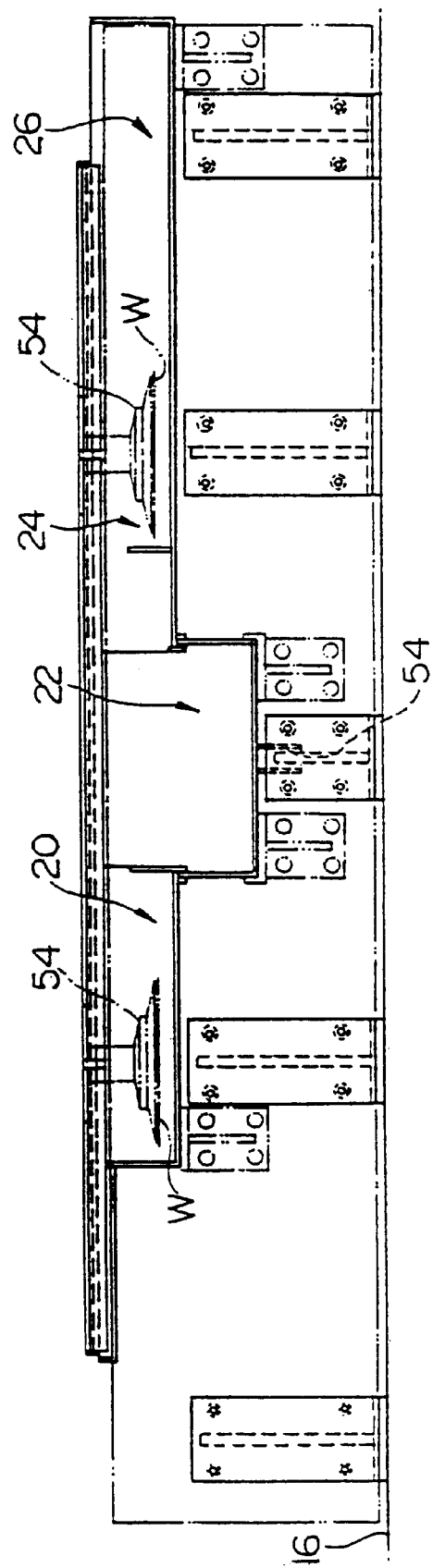
FIG. 7 is a vertical section view showing first through fourth conveyor sections of a first embodiment of a semiconductor wafer chamfer polishing apparatus according to the present invention.

As shown in FIG. 7, the first delivery section 20 is a rectangular water vat provided adjacent to the loader unit 15, the inside of which is filled with purified water which is supplied as cleansing water. Additionally, the second delivery section 22 is a rectangular water vat adjacent to the first delivery section, which is designed to be deeper than the first delivery section 20, designed to catch purified water spilling from the first delivery section 20, and has cleansing water disposal holes 54 formed on the bottom portion so as to allow disposal of the purified water.

The third delivery section 24 and the fourth delivery section 26 are rectangular water vats adjacent to the second delivery section 22 and designed to have the same depth as the first delivery section 20. The third delivery section 24 and the fourth delivery section 26 are in mutual communication and their insides are filled with purified water which is supplied as cleansing water.

Figure 8:
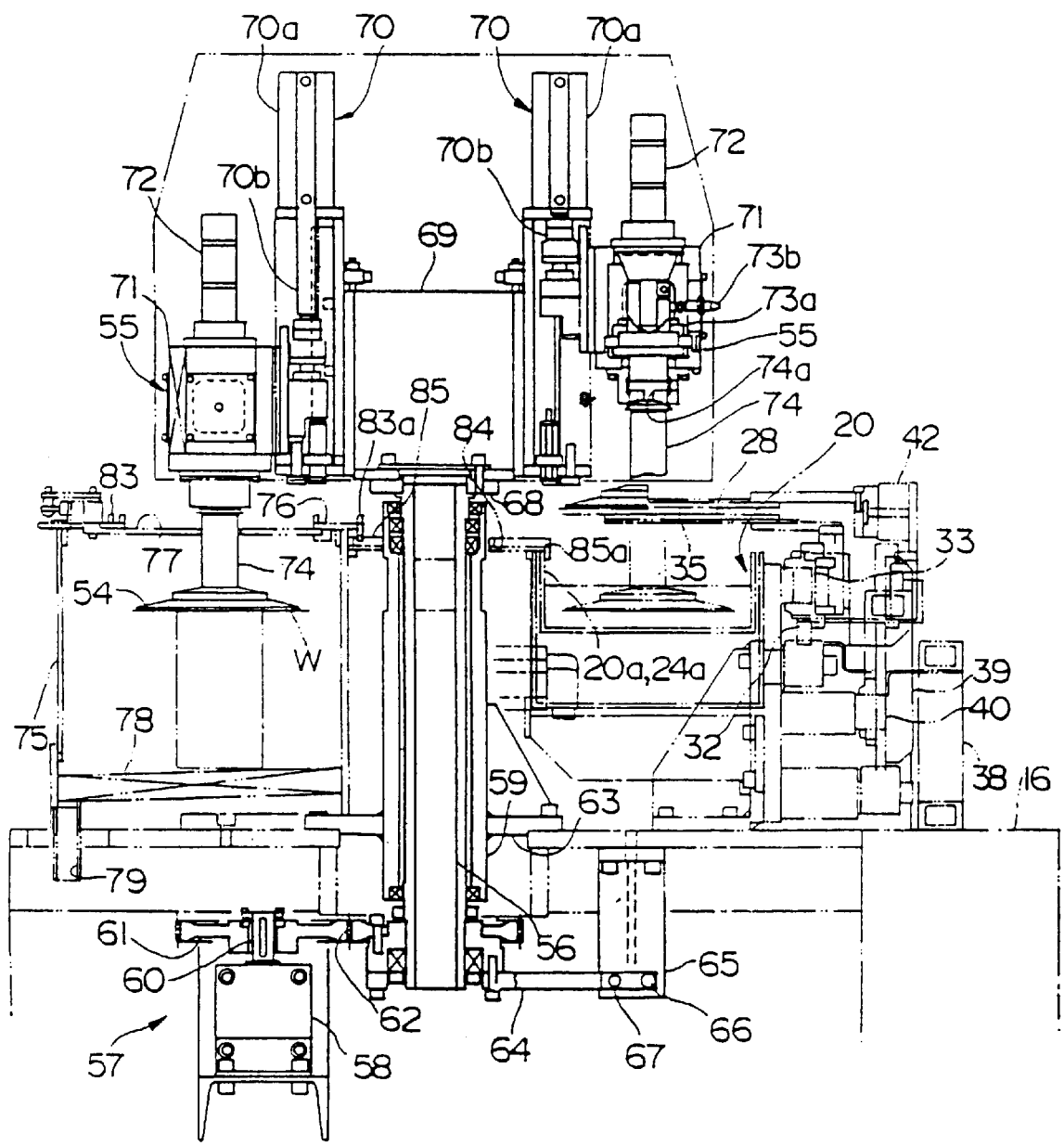
FIG. 8 is a section view along the line X—X of FIG. 3.

As shown in FIG. 8, the front surface polishing chamber transfer device 5 comprises a pair of wafer suction discs 54 for holding semiconductor wafers W by suction from above in the first delivery section 2C and the front surface polishing chamber 4, a pair of suction disc support portions 55 for supporting these wafer suction discs 54 so as to be capable of rotating and moving up and down, and a swinging device 57 which supports these suction disc support portions 55 by means of a rotatable swing shaft member 56 erected between the first delivery section 20 and the front surface polishing chamber 4, which swings the suction disc support portions 55 about the swing shaft member 56. That is, the pair of wafer suction discs 54 are provided at symmetrical positions with respect to the swing shaft member 56.

On the other hand, the reverse surface polishing chamber transfer device 8 comprises a pair of wafer suction discs 54 for holding semiconductor wafers W by suction from above in the third delivery section 24 and the reverse surface polishing chamber 7, a pair of suction disc support portions 55 for supporting these wafer suction discs 54 such as to be capable of rotating and moving up and down, and a swinging device 57 which supports these suction disc support portions 55 by means of a rotatable swing shaft member 56 erected between the third delivery section 24 and the reverse surface polishing chamber 7, which swings the suction disc support portions 55 about the swing shaft member 56.

That is, the reverse surface polishing chamber transfer device 8 and the front surface polishing chamber transfer device 5 are each provided with wafer suction discs 54, suction disc support portions 55, and a swinging device 57 having the same structure. These function as wafer rotation devices which hold the semiconductor wafers W and support the semiconductor wafers W such as to be capable of rotating in a circumferential direction thereof.

The swinging device 57 comprises swing rotary actuators 58 for rotating the swing shaft member 56, and a tubular support member 59 for rotatably supporting the swing shaft member 56 in a state of insertion.

The swing rotary actuators 58 are respectively provided beneath the front surface polishing chamber 4 or the reverse surface polishing chamber 7, and a coupling gear 61 affixed to the rotation drive shaft 60 is engaged with a lower gear 62 affixed to the lower portion of the swing shaft member 56.

The tubular support member 59 passes through the central portion of the base 16 and is supported by lower flange portions 63 provided on the outer circumference of a lower portion which are affixed to an upper surface of the base 16.

A rod-shaped swing stopper 64 which extends in a radially outward direction is affixed to the bottom end of the swing shaft member 56, and swing positioning portions 65 are affixed at two specified locations (one of the locations is not shown in the drawings) on the reverse surface of the upper portion of the base 16. These swing positioning portions 65 are provided at positions at which the tip of the swing stopper 64 swings by a specified amount and stops. That is, positions corresponding to cases wherein the wafer suction disc 54 is swung to the upper portion of the first delivery section 20 or the upper portion of the front surface polishing chamber 4, and swung to the upper portion of the third delivery section 24 or the upper portion of the front surface polishing chamber 7.

Additionally, the swing positioning portions 65 are provided on the side surface of a bottom portion, with a shock absorber 66 for absorbing the impact when the tip portion of the swing stopper 64 makes contact and a positioning bolt 67 for fine adjustment of the stopping position.

An upper flange portion 68 is provided at the upper end of the swing shaft member 56, and a tubular member 69 on the same axis is affixed to the upper portion of the upper flange portion 68. A pair of suction disc elevator air cylinders 70 are provided so as to extend in a vertical direction on the outer circumferential surface of the tubular member 69 at positions which are symmetrical with respect to the axis of the tubular member 69. These suction disc elevator air cylinders 70 comprise cylinder portions 70a affixed to an upper potion and cylinder rod portions 70b which are capable of advancing or retracting in a vertical direction from inside the cylinder portions 70a. The suction disc support portions 55 are affixed to the tips of the cylinder rod portions 70b.

The suction disc support portions 55 comprise a frame portion 71 affixed to the tip of the cylinder rod portion 70b, a rotary motor 72 affixed to the upper portion of the frame portion 71, a decelerator 73a connected to the rotary drive shaft of the rotary motor 72 for decelerating the rotation thereof, a rotational angle sensor 73b for sensing the rotational angle of the wafer suction disc 54 decelerated by the decelerator 73a, and a support rod 74 connected to the rotational shaft of the decelerator 73a and supported at the bottom end of the frame portion 71 such as to be capable of rotating about an axis in the vertical direction. The support rod 74 is connected to a vacuum means not shown in the drawings, and a connection hole 74a which passes vertically therethrough is formed inside.

Figure 14:
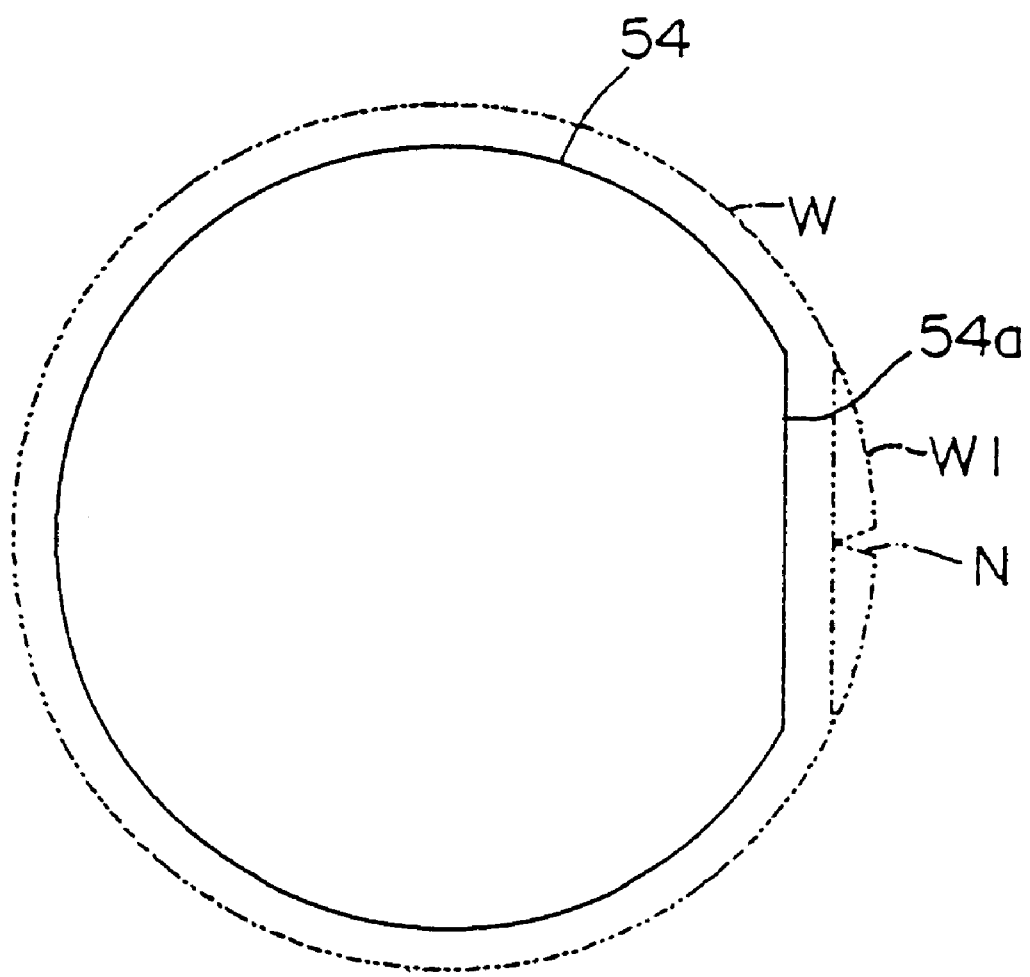
FIG. 14 is an enlarged vertical section view showing a portion for explaining the polishing of chamfers in a first embodiment of a semiconductor wafer chamfer polishing apparatus according to the present invention.

The wafer suction discs 54 have their top surfaces affixed to the bottom ends of the support rods 74, and are capable of rotating by means of rotation of the rotary motor 72 about the same axis. Additionally, the wafer suction discs 54, as shown in FIG. 14, are formed into discs having diameters which are smaller than those of the semiconductor wafers W by a specified amount and having a cutaway portion 54a corresponding to the orientation flats, and are given roughly conical shapes in order to increase the water drainage capability. Furthermore, suction holes (not shown in the drawings) connected to the connection hole 74a are formed on the bottom surfaces of the wafer suction discs 54.

That is, the wafer suction discs 54 and the suction disc support portions 55 hold the semiconductor wafers W, and act as wafer rotating devices for holding the semiconductor wafers W such as to be capable of rotating in the circumferential direction thereof.

Figure 9:
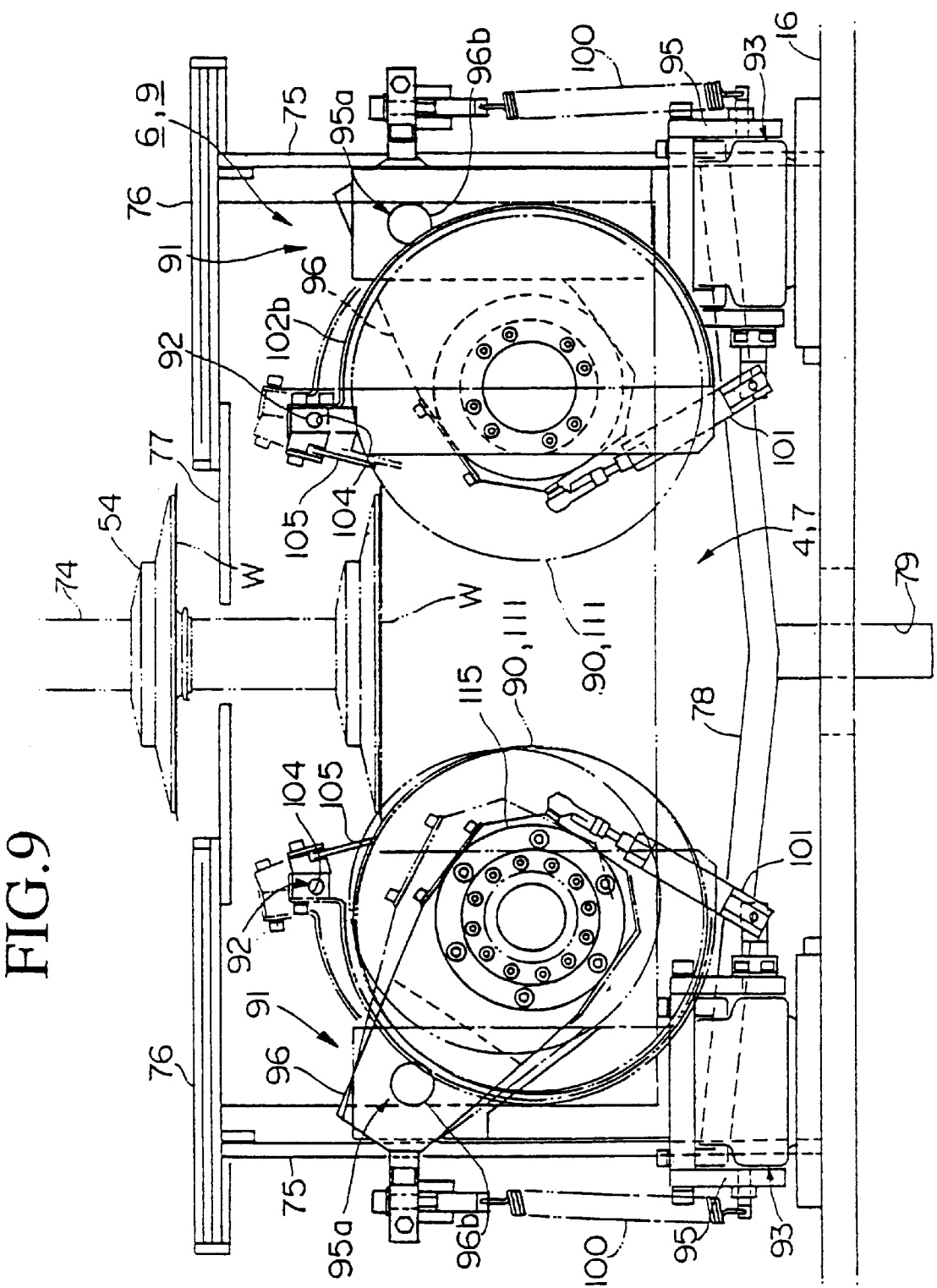
FIG. 9 is a vertical section view showing a surface polishing chamber and a surface polishing device of a first embodiment of a semiconductor wafer chamfer polishing apparatus according to the present invention.

As shown in FIGS. 8 and 9, the front surface polishing chamber 4 and the reverse surface polishing chamber 7 are respectively provided on sides opposite to the first delivery section 20 and the third delivery section 24 with respect to the rotary shaft member 56, and comprise a polishing chamber side plate 75, a polishing chamber top plate 76, a polishing chamber shutter 77 and a polishing chamber bottom plate 78. The polishing chamber bottom plate 78 is tilted from the central portion toward the outside, and a polishing fluid drainage hole 79 for draining polishing fluid used for polishing is formed at the bottom-most portion thereof. The polishing fluid drainage hole 79 is connected to a drainage fluid reservoir (not shown in the drawings) for recycling the polishing fluid which has been used. A mist removal port 75a for letting out mist is provided at the lower portion of the polishing chamber side plate 75.

The polishing chamber top plates 76 are provided such as to cover the top portions of the front surface polishing chamber 4 and the reverse surface polishing chamber 7, and the central portion is provided with a circular top plate opening portion 76a having an inner diameter which is designed to be slightly larger than the outer diameter of the semiconductor wafers W which are held by the wafer suction discs 54.

Additionally, the polishing chamber top plate 76 is provided with a pair of shutter air cylinders 80 which are held such as to be capable of extending and contracting in the longitudinal direction of the base 16 at portions directly above the polishing chamber side plates 75 on the outside, and a pair of board-shaped polishing chamber shutters 77 are respectively affixed by means of coupling members 81 to the tips of the cylinder rods 80a of the shutter air cylinders 80.

A through hole 81a is formed in each coupling member 81, and a guide rod 82 provided on the polishing chamber top plate 76 is inserted into the through hole 81a. That is, the coupling member 81 is supported such as to be capable of horizontal movement along the longitudinal direction of the base 16 by being guided by the guide rod 82.

These polishing chamber shutters 77 are provided along the polishing chamber top plates 76 so as to cover the front surface polishing chamber 4 and the reverse surface polishing chamber 7, and are held on the polishing chamber top plate 76 such as to be capable of opening or closing in the longitudinal direction of the base 16 by means of extension or contraction of the shutter air cylinders 80. Additionally, the pair of polishing chamber shutters 77 are provided with semicircular notches 77a on their mutually opposing inside edges so as to form a circular aperture portion having an inner diameter slightly larger than the diameter of the support rod 74 when closed.

Figure 15:
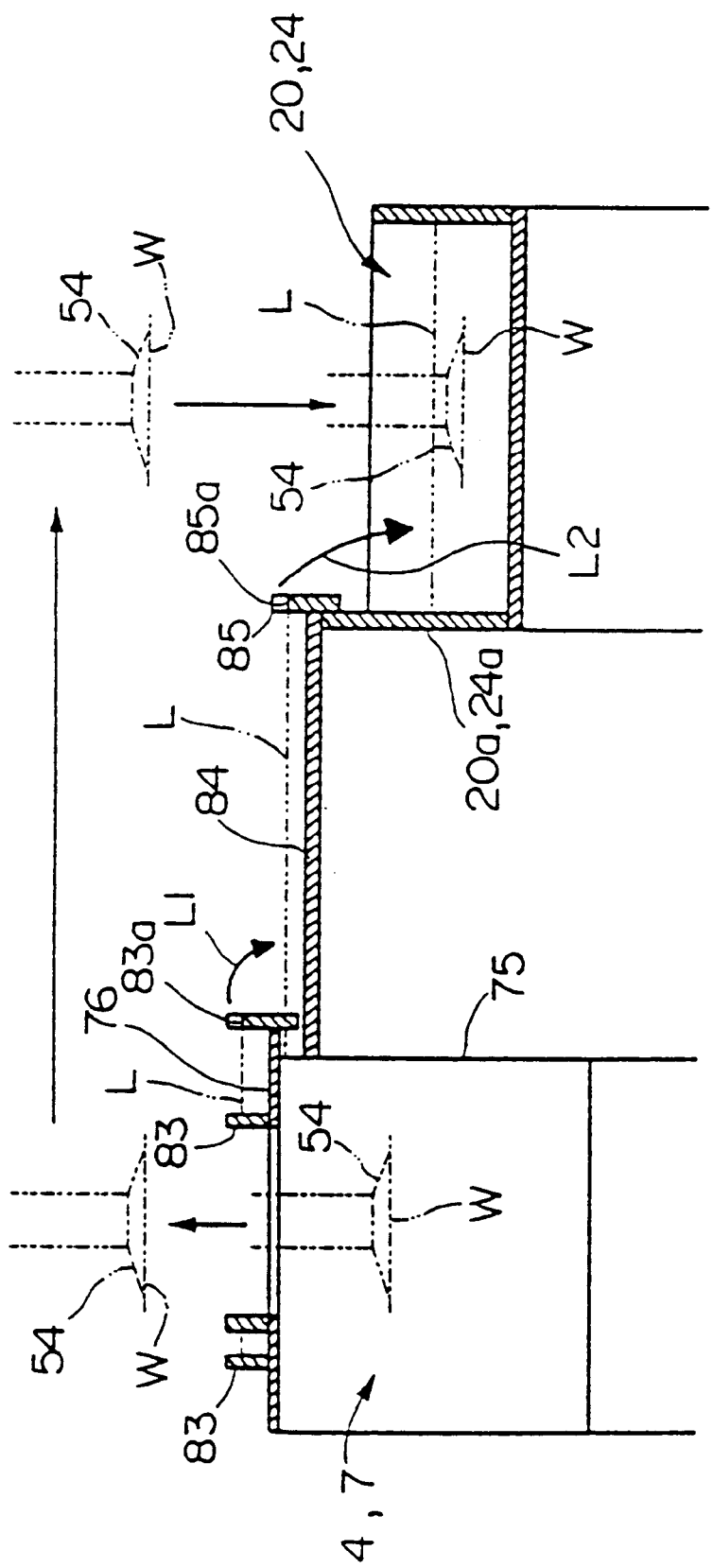
FIG. 15 is a simplified section view showing the arrangement of the polishing chamber roof plate and the intermediate chamber roof plate in a first embodiment of a semiconductor wafer chamfer polishing apparatus according to the present invention.

As shown in FIG. 15, the polishing chamber top plate 76 is provided with a polishing chamber top plate peripheral wall portion 83 which protrudes upwards from a peripheral portion and surrounds the top surface of the polishing chamber top plate.

Additionally, intermediary top plates 84 are respectively provided between the front surface polishing chamber 4 and the first delivery section 20, and between the reverse surface polishing chamber 7 and the third delivery section 24, and these intermediary top plates 84 are provided with intermediary top plate peripheral wall portions 85 which protrude upward at peripheral portions and surround the top surfaces of the intermediary top plates 84.

Each intermediary top plate 84 has one side edge respectively provided above a side plate 20a, 24a on the swing shaft member 56 side of the first delivery section 20 and the third delivery section 24, and the other side edge on the outer side surface of the polishing chamber side plate 75 of the front surface polishing chamber 4 and the reverse surface polishing chamber 7. That is, the intermediary top plate 84 is provided at a position lower than the polishing chamber top plate 76 and at a position higher than the first delivery section 20 and the third delivery section 24.

The polishing chamber top plate peripheral wall portion 83 has a first low wall portion 83a which protrudes less than the other portions formed on the intermediary top plate 84 side, and the intermediary top plate peripheral wall portion 85 has a second low wall portion 85a which protrudes less than the other portions formed respectively at the first delivery section 20 side and the third delivery section 24 side.

Additionally, cleansing water L is supplied to the polishing chamber top plate 76 and intermediary top plate 84 so as to form shallow reservoirs by means of the polishing chamber top plate peripheral wall portion 83 and the intermediary top plate peripheral wall portion 85.

Figure 10:
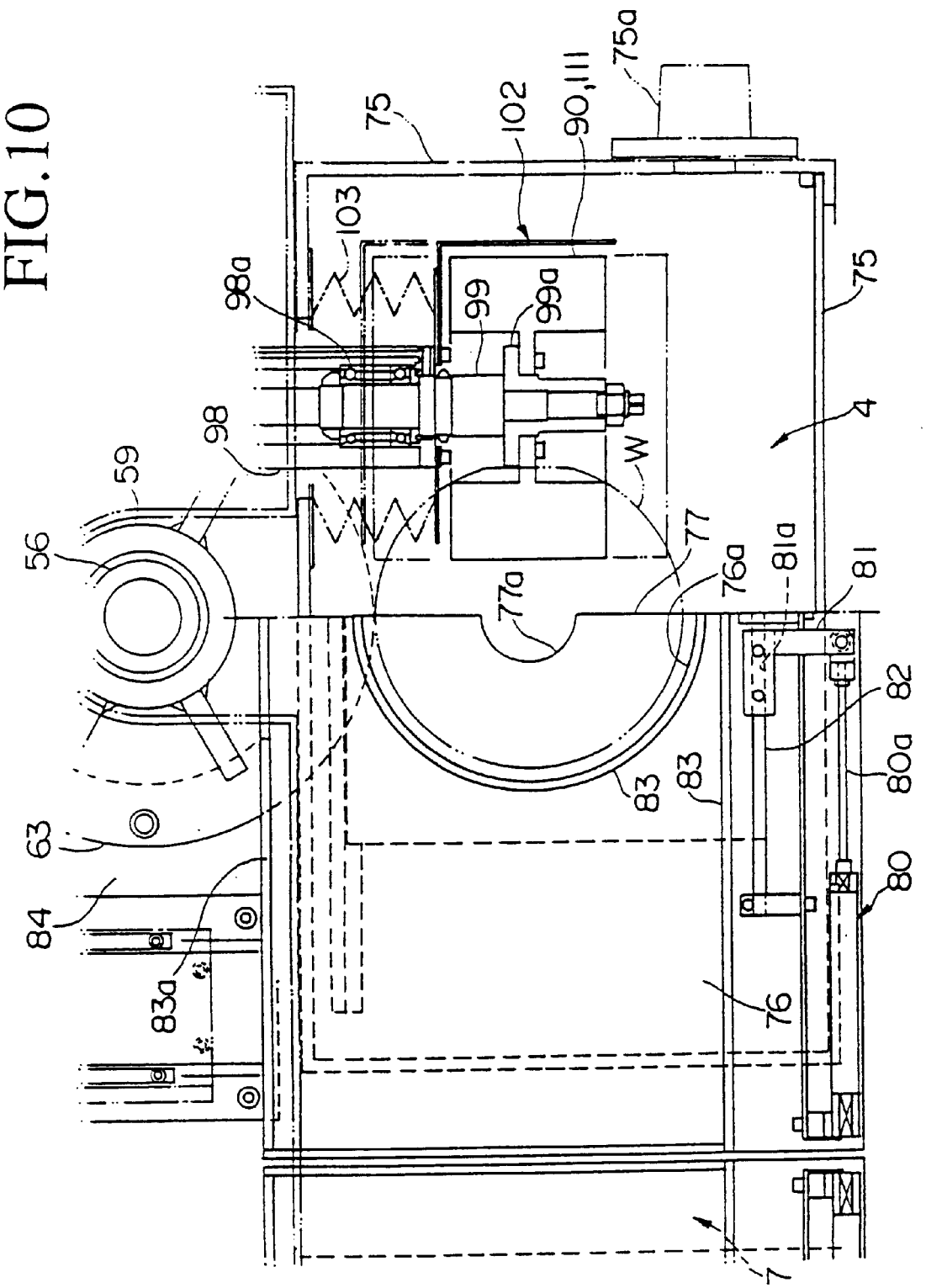
FIG. 10 is a partially cut-away plan view showing a surface polishing chamber and surface polishing device of a first embodiment of a semiconductor wafer chamfer polishing apparatus according to the present invention.
Figure 11:
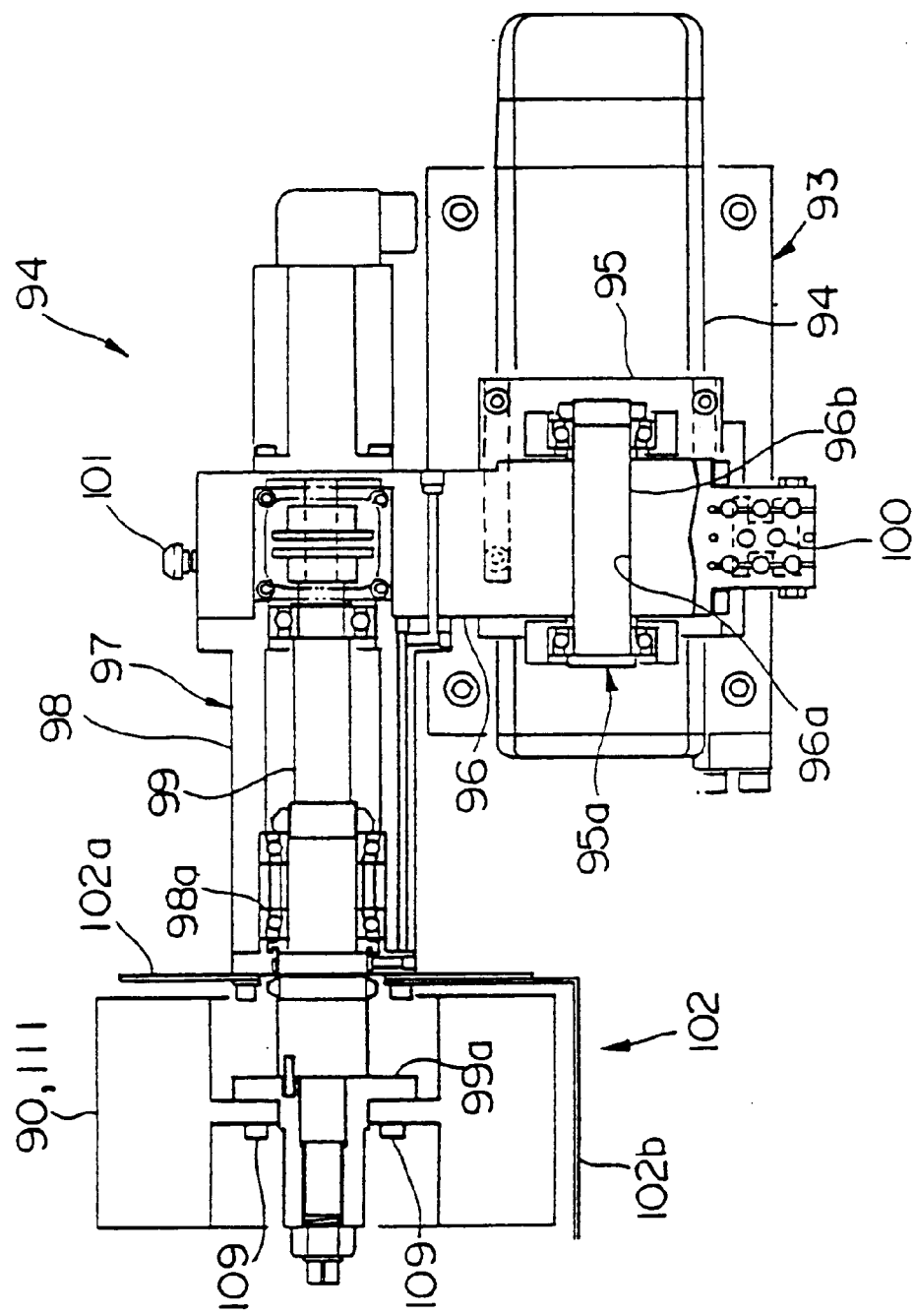
FIG. 11 is a vertical section view showing a portion of a surface polishing device of a first embodiment of a semiconductor wafer chamfer polishing apparatus according to the present invention.

As shown in FIGS. 9 through 11, the front surface polishing device 6 and the reverse surface polishing device 9 each comprises a pair of drums 90 which are provided on both sides in the longitudinal direction of the base 16 centered about the semiconductor wafers W held by the wafer suction discs 54 in the front surface polishing chamber 4 and the reverse surface polishing chamber 7, and are rotatably supported such that their axes are parallel to the front and reverse surfaces of the semiconductor wafers W, i.e., the axes aligned with directions of perpendicular intersection with the longitudinal direction, a pair of drum drive means 91 for rotationally driving and moving these polishing drums 90, and polishing fluid supply means 92 for supplying polishing fluid to the polishing drums 90 and to the chamfer surfaces of the semiconductor wafers W for polishing.

The drum drive means 91 comprise a drum direct-drive unit 93 for advancing and retracting the polishing drum 90 in a direction of perpendicular intersection with the longitudinal direction of the base 16, a drum support portion 94 which is swingably supported on the drum direct-drive unit 93 for connecting the polishing drum 90 to the tip, bringing the polishing drum 90 into pressured contact with the chamfers of the semiconductor wafers W, and supporting the polishing drum 90 such as to be capable of sliding in the direction of the axis of the semiconductor wafers W.

The drum direct-drive units 93 are respectively provided between the first delivery section 20 and the front surface polishing chamber 4, and between the third delivery section 24 and the reverse surface polishing chamber 7, and comprise a unit main body 94 affixed to the base 16 with an interior ball screw and motor for rotationally driving the ball screw, and a direct-drive portion 95 which is screwed onto the ball screw and is capable of moving along the ball screw.

The drum support 94 comprises a swinging arm portion 96 with a top end which is held such as to be capable of swinging by a pivot bearing portion 95a provided at an upper portion of the direct-drive portion 95, and a drum support shaft portion 97 which is affixed to a bottom end of the swinging arm portion 96 and extends in a direction of perpendicular intersection with the longitudinal direction of the base 16, and rotatably supports the polishing drum 90 at the tip thereof.

The swinging arm portion 96 has a through hole 96a formed at an upper end, and is provided with a swinging rod 96b which is passed through the through hole 96a and is rotatably supported at both ends by the pivot bearing 95a.

The drum support shaft portion 97 comprises a drum tubular member 98 which is affixed to the bottom end of the swinging arm portion 96 and passes through the polishing chamber side plate 75 on the inside of the front surface polishing chamber 4, and a drum rotational shaft member 99 having a common axis inside the drum tubular member 98 and rotatably passed therethrough by means of the bearing portion 98a.

The drum rotational shaft member 99 has a polishing drum 90 with a common axis affixed to the tip end, and a rotational drive source which is not shown in the drawings connected to the rear end.

The top end of the swinging arm portion 96 and the bottom portion of the direct-drive portion 95 are coupled by a balancing spring 100, and the bottom end of the swinging arm portion and the bottom portion of the direction drive portion 95 are coupled by a pressure-applying air cylinder. The balancing spring 100 holds the drum support shaft portion 97 which is supported by the swinging arm portion 96 at a constant height, and sets the height position of the polishing drum 90 attached to the drum support shaft portion 97.

Additionally, during polishing, the pressure-applying air cylinder 101 presses the drum support shaft portion 97 held at a constant height by the balancing spring 100 at a constant pressure diagonally above the semiconductor which is held against the wafer suction disc 54, so that the outer circumferential surface of the rotating polishing drum 90 attached to the drum support shaft portion 97 is pressed against the chamfers on the front surface side of the semiconductor wafers W by the front surface polishing device, and against the chamfers on the reverse surface side of the semiconductor wafers W by the reverse surface polishing device.

A drum cover 102 is provided on the tip of the drum tubular member 98 so as to cover half of the outer circumferential surface of the polishing drum 90.

The drum cover 102 comprises a disc portion 102a which is affixed to the drum tubular member 98 and provided proximate to the inner surface of the polishing drum 90, and an arcuate plate portion 102b which in close proximity covers the half of the outer circumferential surface of the polishing drum 90 opposite to the semiconductor wafers W respectively provided within the front surface polishing chamber 4 and the reverse surface polishing chamber 7.

An accordion member 103 which covers each of the drum tubular members 98 in the front surface polishing chamber 4 and in the reverse surface polishing chamber 7 is attached between the disc portion 102a and the polishing chamber side plate 95 inside the front surface polishing chamber 4 and between the disc portion 102a and the polishing chamber side plate 95 inside the reverse surface polishing chamber 7.

These accordion members 103 prevent polishing fluid from entering the drum tubular members 98 during polishing.

Each polishing fluid supply means 92 comprises a plurality of supply nozzles 104 attached to the top portion of the arcuate plate portion 102b of a drum cover 102, a polishing fluid brush 105 affixed to the supply nozzles 104 and provided on the side of the semiconductor wafer W which is held by the wafer suction disc 54, and a polishing fluid introduction means 106 connected to the supply nozzle 104 for supplying polishing fluid.

The polishing fluid brush 105 is formed from an elastic material such as nylon, and the tip is provided in a state of contact with the outer circumferential surface of the polishing drum 90 along the axial direction.

As shown in FIG. 4, the polishing fluid introduction means 106 comprises a slurry tank 107 for storing polishing fluid, and a slurry pump 108 for drawing up polishing fluid from the slurry tank 107 and sending it to the supply nozzles 104. Reference numeral 109 denotes a cyclone for disposal of exhausted mist used for recycling polishing fluid which has been used.

Figure 12:
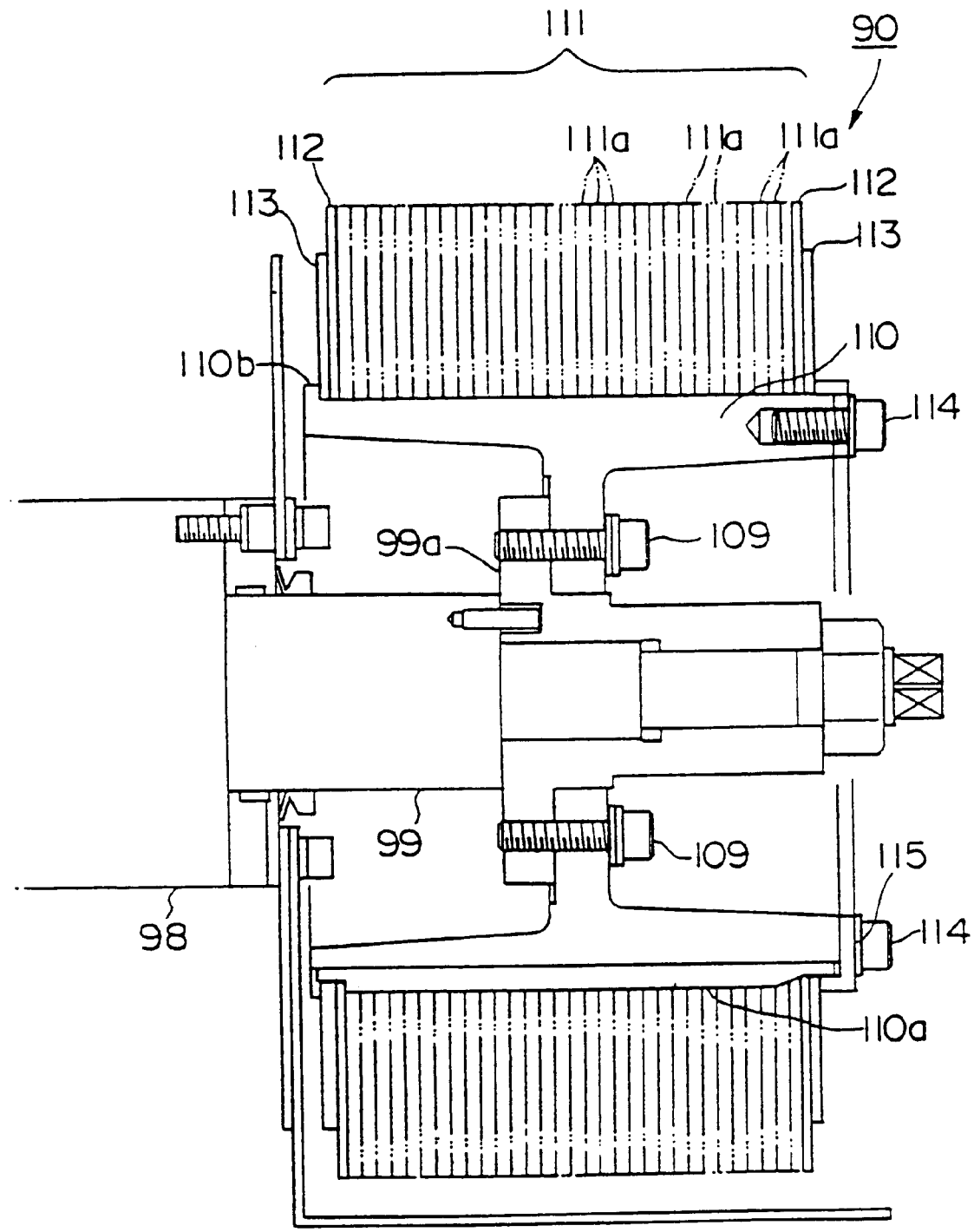
FIG. 12 is a section view showing a polishing drum of a first embodiment of a semiconductor wafer chamfer polishing apparatus according to the present invention.

As shown in FIG. 12, the polishing drum 90 comprises a wheel main body 110 composed of aluminum alloy and affixed by bolts 109 to an attachment flange 99a provided at the tip of the drum rotational shaft member 99 with a common axis, and a polishing cloth 111 provided so as to cover the outer circumferential surface of the wheel main body 110.

A key 110a in the form of a raised strip which extends parallel to the axis and protrudes in the radially outward direction is provided on the outer circumferential surface of the wheel main body 110, in order to prevent rotation of the polishing cloth 111 by applying pressure from the inside of the polishing cloth 111.

The polishing cloth 111 consists of an unwoven fabric wherein the orientations of the fibers are not uniform, with a plurality of annular unit polishing cloths 111a being layered into tubular form, this being attached around the outer circumferential surface of the wheel main body 110 with a common axis.

Annular reinforcement plates 112 composed of vinyl chloride and having the same outer diameter as the polishing cloth 111 are provided at both ends of the polishing cloth 111, and annular presser plates 113 composed of stainless steel and having outer diameters smaller than that of the polishing cloth 111 are provided on both outer sides of the reinforcement plates 112.

Each polishing cloth 111 has a compressibility of 6–10% and in the present embodiment the compressibility is set to 8%. Additionally, the thickness of the polishing cloth 111 in the radial direction is designed to be approximately four times that of the semiconductor wafers W; for example, if the thickness of the semiconductor wafers W is 0.75 mm, then the thickness of the polishing cloth is 3.0 mm.

The compressibility was found by measuring the thickness $T_1$ one minute after applying an initial load $W_0$ to a unit polishing cloth 111a, simultaneously increasing the load to a load $W_1$, and measuring the thickness $T_2$ after one minute, and applying these values to the following formula:

$$\text{Compressibility } (\%) = (T_1 - T_2)/T_1 \times 100$$

(wherein $W_0 = 300$ g/cm$^2$ and $W_1 = 1800$ g/cm$^2$)

The presser plate 113 on the base end of the polishing drum 90 is extended by an expanded diameter portion 110b formed on the outer circumferential surface of the wheel main body 110, and the presser plate 113 on the tip end of the polishing drum 90 is pressed to the base end side by means of an annular polishing cloth presser plate 115 affixed by a bolt 114 to the tip surface of the wheel main body 110.

Figure 13:
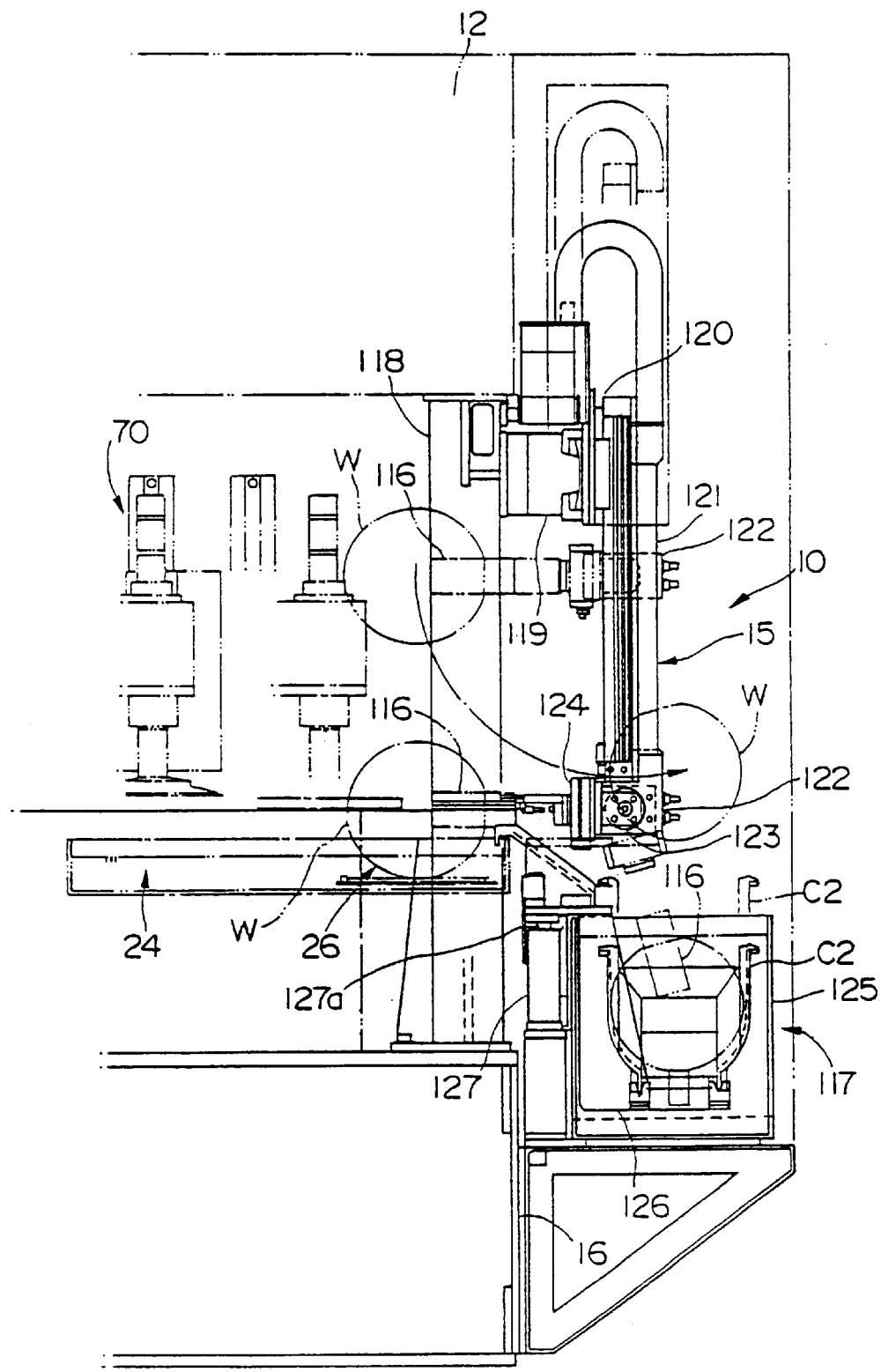
FIG. 13 is a vertical section view showing a wafer storage device of a first embodiment of a semiconductor chamfer polishing apparatus according to the present invention.

As shown in FIG. 13, the wafer storage device 10 comprises an unloader unit 15 provided above the third delivery section 24 which uses a storage hand 116 for removing and transferring semiconductor wafers W which have been transferred to the third delivery section 24, and a storage cassette placement portion 117 for placing storage cassettes C2 inside which the semiconductor wafers W transferred by the unloader unit 15 are to be stored at a specified position.

The unloader unit 15 is supported such as to receive from a beam member 119 which is provided across upper portions of two column members 118 erected on the base 16, and is capable of moving in the length of extension of the beam member 119, i.e. the direction perpendicular to the longitudinal direction of the base 16, by means of a horizontal movement device 120 attached to the beam member 119.

A storage air cylinder 121 capable of extending and retracting in a vertical direction hangs down with the top portion affixed to the side surface of the horizontal movement device 120, and a hand swinging rotary portion 122 having a storage hand 116 is held on the tip of the bottom portion of the storage air cylinder 121.

The hand swinging rotary portion 122 comprises a swing rotary actuator 123 for swinging the storage hand 116 about a horizontal axis which is perpendicular to the longitudinal direction of the base 16, and a rotational rotary actuator 124 which rotates the storage hand 116 about an axis in the direction of extension thereof.

A plurality of suction holes (not shown in the drawings) connected to suction means not shown in the drawing are formed at a tip portion of the storage hand, and semiconductor wafers W which are transferred to the fourth delivery section 26 are held by these suction holes.

The storage cassette placement portion 117 is provided on a side surface of the end portion side of the base 16, at a position lower than the fourth delivery section 26. This storage cassette placement portion 117 comprises a water vat portion 125 capable of containing four storage cassettes C2 arranged along the direction perpendicular to the longitudinal direction of the base 16 and filled with purified water, four cassette hands 126 provided inside the water vat portion 125 on which the storage cassettes C2 are separately placed and positioned, and four cassette elevator air cylinders 127 provided between the water vat portion 125 and the base 16 for holding the respective cassette hands 126 such as to be capable of separate elevation thereof.

The storage cassettes C2 are designed such that the placement positions of the semiconductor wafers W are oriented in such a manner that the front and reverse surfaces are parallel to a longitudinal direction of the base 16 and the axes of the semiconductor wafers W are horizontal.

Additionally, each cassette hand 126 has a L-shaped vertical cross-section, and the upper portion is affixed to the tip of a corresponding cylinder rod 127a of the cassette elevator air cylinder 127.

Next, a semiconductor wafer chamfer polishing method for a first embodiment of the semiconductor wafer chamfer polishing apparatus according to the present invention will be explained separately by reference to a wafer removal step, a wafer positioning step, a front surface polishing step, a wafer flipping step, a reverse surface polishing step, and a wafer storage step.

[Wafer Removal Step]

First, a cassette C1 containing semiconductor wafers W which have not yet been polished is set at a specified position on the cassette placement table 13 such that the front surfaces of the semiconductors W face downward.

The loader unit 15 is activated, and the withdrawal hand 14 is moved from the central portion of the cassette placement table 13 to a semiconductor wafer W at a specified position, then the semiconductor wafer W is held by suction thereto. Then, the withdrawal hand 14 is returned to the central portion of the cassette placement table 13 and rotated about a vertical axis so that the tip portion holding the semiconductor wafer W is faced toward the wafer positioning unit 2.

[Wafer Positioning Step]

The withdrawal hand 14 holding the semiconductor wafer W is moved upwards by the loader unit 15, and after being set to a height corresponding to the placement stand 2a of the wafer positioning unit 2, the withdrawal hand 14 is moved horizontally over the placement stand 2a of the wafer positioning unit 2.

Then, the suction is turned off with the semiconductor wafer W held above the placement stand 2a, and the semiconductor wafer W is released to be placed on the wafer positioning unit 2.

Next, the wafer positioning unit 2 is activated to perform centering and positioning of the orientation flat of the semiconductor wafer W on the placement stand 2a, so as to position the semiconductor wafer W in a specified orientation.

[Front Surface Polishing Step]

Next, the first hand 28 is raised by the first elevator cylinder 30 and the positioned semiconductor wafer W is placed thereon and held by means of suction through the suction grooves 28a.

Then, the first hand 28 is moved horizontally above the first delivery section 20 by means of the first rodless cylinder 29, so as to transfer the semiconductor wafer W to the first delivery section 20.

In this condition, the wafer suction disc 54 newly positioned above the first delivery section 20 is lowered along with the suction disc support portion 55 by means of the suction disc elevator air cylinder 70 and brought into contact with the semiconductor wafer W. At this time, the suction of the first hand 28 is turned off to release the semiconductor wafer W, and then the wafer suction disc 54 is made to hold the semiconductor wafer W by suction on a common axis.

While the wafer suction disc 54 is holding the semiconductor wafer W, the swing rotary actuator 58 is driven so as to rotate the rotate the swing shaft member 56 by 180° and swing the wafer disc panel 54 by 180° into position above the front surface of the polishing chamber 4.

Then, the polishing chamber shutters 77 of the front surface polishing chamber 4 are slid by operation of the shutter air cylinders 80 so as to open the top plate aperture portion 76a of the polishing chamber top plate 76.

With the top plate aperture portion 76a open, the wafer suction disc 54 is lowered by means of the suction disc elevator air cylinder 70 to a specified position inside the front surface polishing chamber 4. At this time, the orientation of the semiconductor wafer W which is being held by the wafer suction disc 54 is such that the orientation flat is aligned with the direction perpendicular to the longitudinal direction of the base 16.

Furthermore, in this condition, the polishing chamber shutters 77 are once again slid by operation of the shutter air cylinders 80 so as to close the top plate aperture portion 76a of the polishing chamber top plate 76. At this time, the support rod 74 is positioned inside the circular aperture portion formed by the notch portions 77a of the polishing chamber shutters 77 which are in mutual contact.

Next, the drum direct-drive unit 93 is driven in order to move the pair of drums 90 inside the front surface polishing chamber 4 from the base 16 side to both sides of the semiconductor wafer W which is being held.

Furthermore, the pressure-applying air cylinder 101 is activated so as to push the swinging arm portion 96 upward and bring the polishing cloths 111 on the pair of polishing drums 90 into a state of pressured contact with the chamfers on the front surface side from both sides of the semiconductor wafer W, with a specified amount of pressure. At this time, the orientation flat of the semiconductor wafer W is brought into contact with the area proximate to the bottom of the polishing fluid brush 105 on the polishing cloth 111 of one of the polishing drums 90.

In this condition, the polishing fluid drawn up from the slurry tank 107 by driving the slurry pump 108 is supplied from one of the supply nozzles 104 to the polishing cloth 111. Then, a rotary drive source not shown in the drawings is driven so as to perform polishing by rotating the polishing drum 90 contacting the chamfer of the orientation flat such that the polishing cloth 111 slides along the tilt of the chamfer on the orientation flat from the outer edge toward the center of the semiconductor wafer W.

At this time, the polishing fluid supplied from the supply nozzles to the polishing cloth 111 moves toward the semiconductor wafer W due to its own weight and the rotation of the polishing drum 90, comes into contact with the tip of the polishing fluid brush 105, and spreads in the axial direction of the polishing drum 90. That is, the polishing fluid is uniformly supplied in the axial direction of the polishing drum 90 and is absorbed into the polishing cloth 111, so that excellent polishing capabilities are gained from the polishing cloth 111 in any direction along the axis.

After the chamfer on the orientation flat is completely polished, the other polishing drum 90 is rotated in a similar manner and polishing fluid is supplied to the polishing cloth 111 from the other supply nozzle 104. Simultaneously, the rotational motor 72 is driven so as to rotate the wafer suction disc 54 along with the semiconductor wafer w by 180. At this time, the rotation of the rotational motor 72 is decelerated to a specified rotational speed by means of the decelerator 73a, and the rotational angle of the wafer suction disc 54 is sensed by the rotational angle sensor 73b in order to rotate the semiconductor wafer W by precisely 180°.

That is, since the pair of polishing drums 90 are positioned symmetrically with respect to the axis of the semiconductor wafer W on both sides of the semiconductor wafer W which is being rotated, the chamfers on the front surface side can be polished over their entire circumference by rotating the semiconductor wafer W by half the circumference.

At this time, since the polishing cloth 111 is slid toward the axis of the semiconductor wafer W along the chamfers as shown in FIG. 1, the direction of movement (indicated by the arrow A in the drawing) of the polishing cloth 111 at the point of contact between the polishing cloth 111 and the chamfer M of the semiconductor wafer W and the direction of movement of the chamfer M of the semiconductor wafer W intersect perpendicularly, so as prevent the occurrence of ridges in the circumferential direction due to polishing.

Therefore, the polishing drum 90, the drum drive means 91 and the polishing fluid supply means 92 function as a polishing cloth drive mechanism for bringing the polishing cloth 111 into pressured contact so as to be elastically deformed against the chamfers M of the semiconductor wafer W while supplying polishing fluid, while holding the polishing cloth 111 such as to be capable of moving from an outer edge to a center of the semiconductor wafer W along the incline of the chamfers M.

Furthermore, since the polishing cloth 111 is slid while being pressed into contact so as to be elastically deformed against the chamfer surface M, a bulge portion 111b of the polishing cloth 111 which contacts the outer side surface S of the semiconductor wafer W is formed, and the bulge portion 111b is brought into pressured contact with the outer side surface S and slid from the outer side surface S toward the chamfers M. That is, while the chamfer M is being polished by the polishing cloth 111, the outer side surface S is also simultaneously polished without the occurrence of ridges along the circumferential direction.

Additionally, since the unit polishing cloths 111a are composed of unwoven fabrics, the fibers of the unit polishing cloths 111a are arranged in random orientations, so that excellent polishing characteristics can be obtained whether the chamfer M is brought into contact with the outer circumferential edge or the front or reverse surface near the outer circumferential edge of the unit polishing cloth 111a.

Additionally, since annular reinforcement plates 112 having higher rigidities than the polishing cloth 111 are provided on both ends in the axial direction of the polishing cloth 111, the unit polishing cloths 111a are supported from both ends in the axial direction of the polishing cloth 111 so as to prevent the unit polishing cloths 111a from creasing or spreading in the axial direction so as to separate from each other.

Furthermore, the polishing fluid used for polishing either drips directly from the polishing drum 90 onto the polishing chamber bottom plate 78, or flows onto the polishing chamber bottom plate 78 by being directed downward by the arcuate plate portions 102a of the drum cover 102. The disc portion 102a of the drum cover 102 prevents the polishing fluid from flying off the drum tubular member 98 into the surrounding areas and the arcuate plate portions 102b prevent the polishing fluid from flying onto the polishing chamber side plate 75.

The polishing fluid which has dropped onto the polishing chamber bottom plate 78 follows the incline to flow to the polishing fluid drainage holes 79 and is drained into a drainage reservoir portion (not shown in the drawings). The used polishing fluid in the drainage reservoir portion is treated for mist removal by means of a cyclone 109 for reuse.

Additionally, the polishing drum 90 is moved by a specific distance in the axial direction by means of the drum direct-drive unit 93 each time a semiconductor wafer W is polished, so that polishing is performed over a wide range of the outer circumferential surface of the polishing cloth 111 so as to ensure that the polishing drum 90 has a long life.

After polishing the chamber M on the front surface side, the polishing chamber shutters 77 are slid to open the top plate aperture portion 76a of the polishing chamber top plate 76. Then, the wafer suction disc 54 holding the semiconductor wafer w is raised above the polishing chamber top plate 76 by the suction disc elevator air cylinder 70.

In the front surface polishing chamber 4, while the chamfer M on the front surface side of the semiconductor wafer W held by one of the wafer suction discs 54 is being polished, the other wafer suction disc 54 performs the wafer withdrawal step and the wafer positioning step so as to hold another semiconductor wafer W which has been conveyed by the first delivery section 20.

In this condition, the swinging rotary actuator 58 is driven so as to rotate the swing shaft member 56 to swing the wafer suction discs 54 through 180°. That is, the semiconductor wafer w held by one of the wafer suction discs 54 is transferred once again transferred above the first delivery section 20 while the semiconductor wafer W held by the other wafer suction disc 54 is transferred above the front surface polishing chamber 4 to undergo polishing of the chamfer m on the front surface side as with the semiconductor wafer W held by the other wafer suction disc 54.

During the swinging action, polishing fluid may drip from the semiconductor wafer w which has already been polished and the wafer suction disc 54 held thereby onto the polishing chamber top plate 76 and the intermediary top plate 84. However, since the peripheral portions of the polishing chamber top plate 76 and the intermediary top plate 84 are made higher by the polishing chamber top plate peripheral wall portion 83 and the intermediary top plate peripheral wall portion 85 so as to hold cleansing water, the polishing fluid which has dropped will not flow from the polishing chamber top plate peripheral wall portion 83 and the intermediary top plate peripheral wall portion 85 to other portions so as to dry and stick thereto.

Additionally, since the intermediary top plate 84 is made lower than the polishing chamber top plate 76 and higher than the first delivery section 20 and the third delivery section 24, and a first low wall portion 83a and second low wall portion 85a are respectively formed on the polishing chamber top plate peripheral wall portion 83 and the intermediary top plate peripheral wall portion 85, the polishing fluid on the polishing chamber top plate 76 will flow along with the cleansing water L from the polishing chamber top plate 76 past the first low wall portion 83a to the intermediary top plate 84 as indicated by the arrow L1 in FIG. 15, and will flow from the intermediary top plate 84 past the second low wall portion 85a to the first delivery section 20 and the third delivery section 24 as indicated by the arrow L2 in FIG. 15.

[Wafer Flipping Step]

After the semiconductor wafer W which has the front surface polished has been transferred above the first delivery section 20, the wafer suction disc 54 is lowered to a state of immersion in the purified water of the first delivery section 20, and the wafer suction disc 54 is rotated by a specific amount. At this time, the polishing fluid attached to the semiconductor wafer W and the wafer suction disc 54 is rinsed away by the purified water.

After the polishing fluid has been rinsed away, the wafer suction disc 54 is raised again to a position above the first delivery section 20, and the second hand 35 is set at a position lower than the wafer suction disc 54 by the second elevator cylinder 37 while the second rodless cylinder 36 is moved horizontally to a position below the wafer suction disc 54 of the first delivery section 20.

In this condition, the wafer suction disc 54 is lowered and the semiconductor wafer W is placed on the second hand 35. At this time, the suction of the wafer suction disc 54 is turned off and the semiconductor wafer W is released, so that the bottom surface of the semiconductor wafer W is held by the suction holes 35a on the second hand 35, i.e., the semiconductor wafer W is held by suction of the front surface side.

Next, the second hand 35 holding the semiconductor wafer W is moved horizontally to the second delivery section 22 by means of the second rodless cylinder 36. The second hand 35 which has been transferred to the second delivery section 22 is set to a position higher than the bottom of the second delivery section 22 by at least the radius of the semiconductor wafer W.

In this condition, the flipping actuator 42 is activated so as to rotate the second hand 35 by 180° about an axis in the direction of extension of the second hand 35.

Then, the third hand 43 is moved underneath the semiconductor wafer W held by the second hand 35 by means of the third elevator cylinder 45 and the third rodless cylinder 44.

After the third hand 43 has assumed a position underneath the second hand 35, the second hand 35 is lowered to place the semiconductor wafer W on the third hand 43. At this time, the suction of the second hand 35 is turned off to release the semiconductor wafer W, and the bottom surface of the semiconductor wafer W is held by the suction holes 35a on the second hand 43, i.e., the semiconductor wafer W is held by suction of the reverse surface side.

After the semiconductor wafer W has been attached, the third hand 43 is moved horizontally to the third delivery section 24 by means of the third rodless cylinder 44.

[Reverse Surface Polishing Step]

After the third hand 43 has been directed to the third delivery section 24, a wafer suction disc 54 of the reverse surface polishing chamber transfer device 8 which has been positioned above the third delivery section 24 is lowered into contact with the top surface of the semiconductor wafer W on the third hand 43. At this time, the suction of the third hand 43 is turned off so as to release the semiconductor wafer W, and the top surface of the semiconductor wafer W is held by the wafer suction disc 54 of the reverse surface polishing chamber transfer device 8, i.e., the semiconductor wafer W is held by suction of the front surface side.

Subsequently, as with the front surface polishing step, the semiconductor wafer W which is held with the reverse surface facing down is transferred into the reverse surface polishing chamber 7 by means of the reverse surface polishing chamber transfer device 8 and the chamfers on the orientation flat and entire circumference of the outer edges of the reverse surface side are polished. At this time as when the front surface side is polished, the outer side surfaces are simultaneously polished on the reverse surface side.

Then, after the chamfers on the reverse surface side have been polished, as with the front surface polishing step, the semiconductor wafer W held on the wafer suction disc 54 of the reverse surface polishing chamber transfer device 8 is once again transferred above the third delivery section 24.

As with the front surface polishing step, while the chamfers M on the reverse surface side of the semiconductor wafer W held by one of the wafer suction discs 54 are being polished in the reverse surface polishing chamber, the other wafer suction disc 54 holds another semiconductor wafer W which has undergone the front surface polishing step and the wafer flipping step and has been conveyed to the third delivery section 24.

In this condition, the swinging rotary actuator 58 is driven to rotate the swing shaft member 56 so as to swing both wafer suction discs 54 by 180°. That is, the semiconductor wafer W held by one of the wafer suction discs 54 is once again transferred above the third delivery section 24 while the semiconductor wafer W held by the other wafer suction disc 54 undergoes polishing of the chamfer M on the reverse surface side in the same manner as the semiconductor wafer W held by the wafer suction disc 54 which has already had the reverse surface polished.

[Wafer Storage Step]

After the semiconductor wafer W which has had the reverse surface polished is transferred above the third delivery section 24, the wafer suction disc 54 holding the semiconductor wafer W is lowered to a position of immersion in the purified water of the third delivery section 24, and the wafer suction disc 54 is rotated by a specified amount. At this time, polishing fluid adhering to the semiconductor wafer W and the wafer suction disc 54 is rinsed away by the purified water.

After rinsing away the polishing fluid, the wafer suction disc 54 is further lowered and the semiconductor wafer W is placed on a fourth hand 50 brought proximate to the bottom portion of the third delivery section 24. At this time, the suction of the wafer suction disc 54 is turned off to release the semiconductor wafer W, and the semiconductor wafer W is positioned and held by means of the projections 50a on the fourth hand 50.

Next, the fourth hand 50 holding the semiconductor wafer W is moved horizontally by the fourth rodless cylinder 51 to the fourth delivery section 26 while in a state of immersion. At this time, the side portions in the direction of movement of the fourth hand 50 which has been moved to the fourth delivery section 26 are fitted with the fourth hand support member 53b of the hand lifting/lowering air cylinder 53.

Subsequently, the fourth hand 50 is raised above the fourth delivery section 26 with the semiconductor wafer W placed thereon, by means of the hand lifting/lowering air cylinder 53.

At this time, the unloader 15 is pre-activated so as to position the tip portion of the storage hand 116 above the fourth delivery section 26 with the suction holes facing down, and the raising of the fourth hand 50 is stopped at a position at which the semiconductor wafer W contacts the storage hand 116.

In this condition, the top surface of the semiconductor wafer W is drawn up by the suction holes of the storage hand 116 to hold the semiconductor wafer W.

Subsequently, the fourth hand 50 is once again lowered proximate to the bottom portion of the fourth delivery section 26 by means of the hand lifting/lowering air cylinder 53.

Next, the storage hand 116 which holds the semiconductor wafer w in a horizontal state is rotated by 90° with the direction of extension as the axis by operating the rotational rotary actuator 124, so as to put the semiconductor wafer W into a vertical state. Then, while maintaining this condition, the storage hand 116 is raised along with the hand swinging rotary portion 122 by operating the storage air cylinder 121, after which the swinging rotary actuator 123 is operated to swing the storage hand 116 downward by rotation over 105° about a horizontal axis perpendicular to the longitudinal direction of the base 16, thereby positioning the semiconductor wafer W above the water vat portion 125 of the storage cassette placement portion 117.

Furthermore, by driving the horizontal direction movement device 120 the storage hand 116 is moved in the direction of extension of the beam member 119 so as to position the semiconductor wafer W directly above the storage position of a specified storage cassette C2.

Subsequently, the storage air cylinder 121 is extended so as to lower the semiconductor wafer W held by the storage hand 116 to a position of storage in the storage cassette C2. Then, the suction of the storage hand 116 is turned off to release the semiconductor wafer W and store it inside the storage cassette C2.

After a specified number of semiconductor wafers W have been stored inside the storage cassette C2 by means of the above steps, the cassette hand 126 on which the storage cassette C2 is placed is raised by means of the cassette lifting/lowering air cylinder 127, so as to expose the handle portion of the storage cassette C2 above the water vat portion 125. Thereafter, the semiconductor wafers W are removed from the water vat portion 125 along with the storage cassette C2 and transferred to the next procedure.

In a conventional semiconductor wafer chamfer polishing apparatus, the chamfers are polished as follows.

First, the semiconductor wafers conveyed by a conveyor are attached to front surface side holding tools in order to polish the chamfers on the front surfaces. After polishing the front surface side, the semiconductor wafers are detached and attached to reverse surface side holding tools. In this condition, the chamfers on the reverse surface side are polished and the semiconductor wafers are detached from the holding tools after the reverse sides have been polished in order to convey them to the next procedure.

That is, in conventional semiconductor wafer chamfer polishing apparatus as mentioned above, after the chamfers on the front surface side have been polished, the semiconductor wafers are transferred from the front surface side holding tools to the reverse surface side holding tools with polishing fluid still adhering thereto, then the chamfers of the reverse surface side are polished.

Consequently, polishing fluid is present between the reverse surface holding tools and the semiconductor wafers, as a result of which the portions of contact of the semiconductor wafers with the holding tools, i.e., the front surface or the reverse surface, are slightly polished, thus leaving contact marks of the holding tool.

The semiconductor wafer chamfer polishing apparatus of the first embodiment described above also has the object of preventing the front and reverse surfaces of the semiconductor wafers at portions other than the chamfers from being polished by polishing fluid adhering thereto. Since this semiconductor wafer chamfer polishing apparatus is provided with a first delivery section 20 and a third delivery section 24 for cleansing the semiconductor wafers W apart from the front surface polishing chamber 4 and the reverse surface polishing chamber 7, the semiconductor wafers W which have had the chamfers M on the front surface side polished in the front surface polishing chamber 4 can be cleansed of polishing fluid adhering to the front surface during polishing by transferring them to the first delivery section 20 by means of the front surface polishing chamber transfer device 5.

Furthermore, the semiconductor wafers w which have had the chamfers M on the reverse surface side polished in the reverse surface polishing chamber 7 can be cleansed of polishing fluid adhering to the reverse surface during polishing by transferring them to the third delivery section 24 by means of the reverse surface polishing chamber transfer device 8. Therefore, each time the chamfers M on the front surface side and the reverse surface side are polished, the semiconductor wafers W are immediately rinsed in the first delivery section 20 and the third delivery section 24 provided separately from the front surface polishing chamber 4 and the reverse surface polishing chamber 7, thereby preventing portions which do not require polishing from being polished due to polishing fluid remaining adhered thereto.

Additionally, since the front surface polishing chamber 4 and the reverse surface polishing chamber 7 are provided separately, polishing is performed separately and-in parallel, and other semiconductor wafers W are cleansed in the first delivery section 20 and the third delivery section 24 in parallel.

Furthermore, since the front surface polishing chamber 4 and reverse surface polishing chamber 7 are provided separately from the first delivery section 20 and the third delivery section 24, intermixing of the polishing fluid and cleansing water is rare, and they are both capable of being easily reused.

Furthermore, since the wafer conveyor 3 is provided with wafer flipping means, the front surface side and reverse surface side of the semiconductor wafers polished in the front surface polishing chamber and the reverse surface polishing chamber are made to face in the same direction by means of the wafer flipping means, so that the front surface sides and the reverse surface sides can be polished by identical polishing devices.

Additionally, conventional semiconductor wafer chamfer polishing apparatus are provided with a polishing chamber for polishing the chamfers of semiconductor wafers and a cleansing section for rinsing away polishing fluid which has adhered to the semiconductor wafers during polishing in the polishing chamber by means of cleansing water.

As a result, means for transporting the semiconductor wafers from the polishing chamber to the cleansing section after polishing are usually provided.

That is, in conventional semiconductor wafer chamfer polishing apparatus, when the semiconductor wafers to which polishing fluid has adhered after polishing of the chamfers are being transported from the polishing chamber to the cleansing section, there is a risk of polishing fluid dripping from the semiconductor wafers onto parts present between the polishing chamber and the cleansing section, which may be a source of machine trouble. Additionally, even if the parts are covered, a problem remains in that polishing fluid adhering to the covers is not easily removable if allowed to dry.

The semiconductor wafer chamfer polishing apparatus of the first embodiment also has the object of preventing polishing fluid dripping from transported semiconductor wafers from adhering to parts of the apparatus.

With this semiconductor wafer chamfer polishing apparatus, since a polishing chamber top plate 83 and an intermediary top plate 84 are provided to cover the top portion of the front surface polishing chamber 4 and the reverse surface polishing chamber 7 to the top portion of the first delivery section 20 and the third delivery section 24, the polishing fluid adhering to the semiconductor wafers W withdrawn from the front surface polishing chamber 4 and the reverse surface polishing chamber 7 and moved over the front surface polishing chamber 4 and the reverse surface polishing chamber 7 to the first delivery section and the third delivery section 24 drips onto the polishing chamber top plates 83 and the intermediary top plates 84.

At this time, since the intermediary top plates 84 are lower than the polishing chamber top plates 83 and higher than the first delivery section 20 and the third delivery section 24, i.e., the structure of the top plates is such as to become lower in steps from the front surface polishing chamber 4 and the reverse surface polishing chamber 7 to the first delivery section 20 and the third delivery section 24, and the top surfaces of the polishing chamber top plates 83 and intermediary top plates 84 are filled with cleansing water L, the polishing fluid drips down into the cleansing water L on the top surfaces of the polishing chamber top plates 83 and the intermediary top plates 84 and therefore will not dry but will instead flow in steps from the top portions of the front surface polishing chamber 4 and the reverse surface polishing chamber 7 toward the first delivery section 20 and the third delivery section 24, so as to ultimately collect in the first delivery section 20 and the third delivery section 24 for drainage.

Additionally, conventional semiconductor wafer chamfer polishing apparatus have the following remaining problems.

That is, the polishing drums are formed by winding a single polishing cloth and attaching at a diagonally cut seam by means of adhesives, so that a lot of time and work is expended in order to attach the polishing cloth, and the cloth becomes easily peeled. Additionally, since the polishing cloth has a seam, there is a considerable bump at the seam which can damage the semiconductor wafers being polished.

The semiconductor wafer chamfer polishing apparatus of the first embodiment has the object of allowing polishing cloths to be easily and reliably attached to the polishing drums, and achieving excellent polishing with little damage to the semiconductor wafers.

Since this semiconductor wafer chamfer polishing apparatus has a polishing cloth 111 composed of a plurality of annular unit polishing cloths 111a which are layered around the main body wheel 110, when attaching the polishing cloth, a tubular polishing cloth 111 can be easily formed on the polishing drum 90 simply by layering unit polishing cloths 111a around the main body wheel 110.

Additionally, the polishing cloth 111 formed by annular unit polishing cloths 111a does not have any seams in the circumferential direction, so that peeling will not occur and the semiconductor wafers W will not be damaged.

Furthermore, the thickness of the polishing cloth 111 is determined by the inner diameters and outer diameters of the unit polishing cloths 111a. A specified elasticity can be obtained by changing these diameters.

Additionally, even if the quality of the surface of the polishing cloth 111 decreases, a new polishing cloth 111 can be obtained by peeling away the surface. Therefore, prolonged use is possible without requiring replacement of the polishing cloth 111.

Also, since annular presser plates 113 which sandwich the polishing cloth 111 in a state of pressure in the axial direction are provided at both ends in the axial direction of the polishing cloth 111, the elasticity of the polishing cloth 111 can be adjusted by compressing by a specified amount in the axial direction by applying a specified pressing force in the axial direction to the elastic unit polishing cloths 111a.

Next, the case wherein the first embodiment of the semiconductor wafer chamfer polishing apparatus is applied to semiconductor wafers having notch portions shall be explained with reference to FIG. 16.

When polishing the chamfers of semiconductor wafers having notch portions, the step for polishing the chamfers at the orientation flats in the above-described procedure is replaced by a step for polishing the chamfers at the notch portions.

Figure 16:
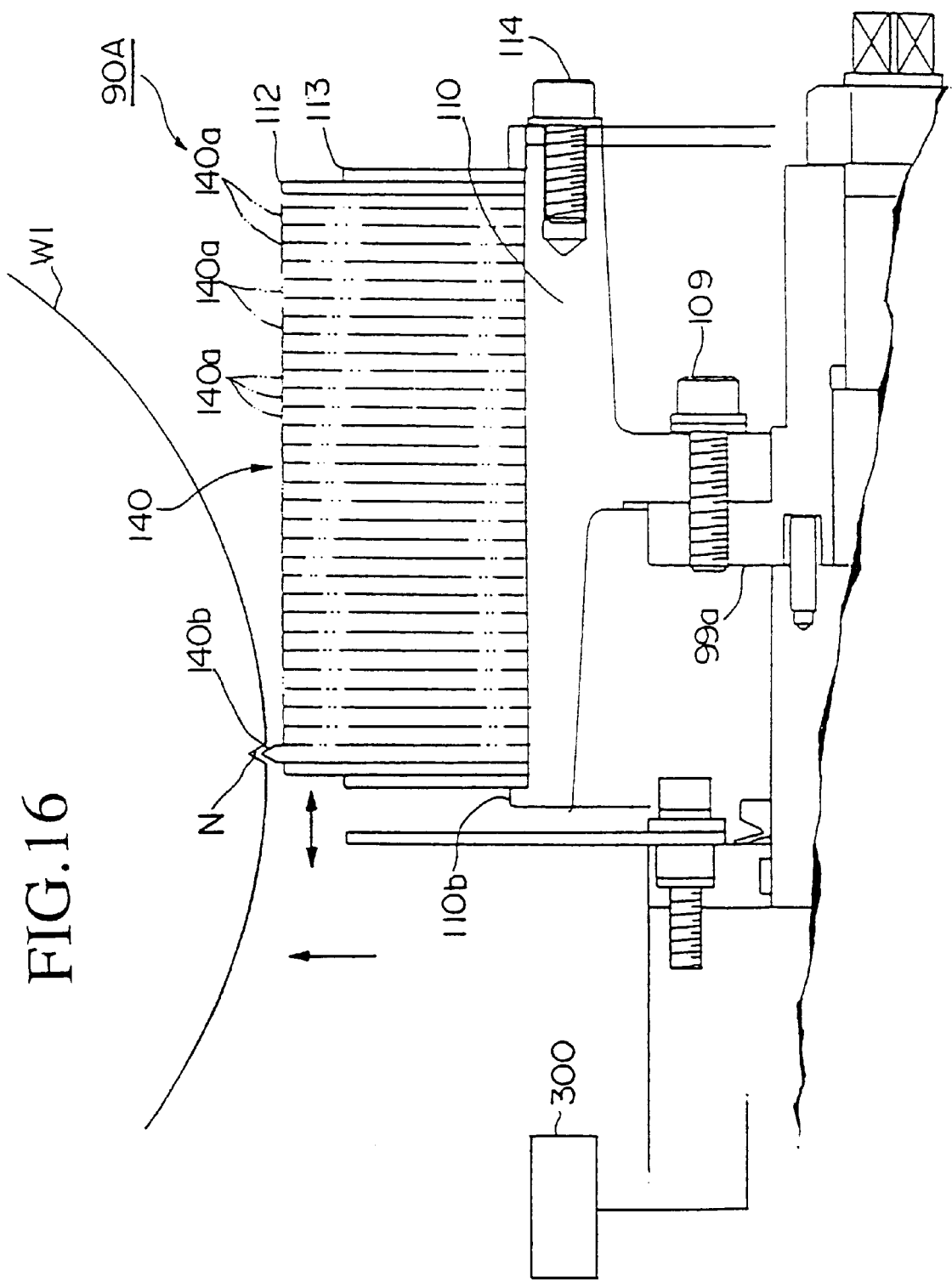
FIG. 16 is an enlarged section view showing a polishing drum used for polishing the chamfers at a notched portion in a first embodiment of a semiconductor wafer chamfer polishing apparatus according to the present invention.

In this case, of the pair of polishing drums 90, at least the one for polishing the notch portion is provided with a polishing-cloth 140 wherein one large-diameter unit polishing cloth 140b with an outer diameter larger than the other small-diameter unit polishing cloths 140a is provided at one end in the axial direction, as shown in FIG. 16.

The difference in the diameters between the large diameter unit polishing cloth 140b and the small-diameter unit polishing cloth 140a is set to be larger than the depth of the cut at the notch portion N which is to be polished.

When polishing the chamfers at the notch portion N, the polishing drum 90A on the notch portion N side of the pair of polishing drums 90 provided at both sides of the held semiconductor wafer W1 is moved by driving the drum direct-drive unit 93 to a position such that the large diameter unit polishing cloth 140b opposes the notch portion N. Furthermore, by operating the pressure-applying air cylinder 101, the swinging arm portion 96 can be pushed upwards to bring the large diameter unit polishing cloth 140b of the polishing drum 90A into pressured contact at a specified pressing force with the chamfers of the notch portion N from both sides of the semiconductor wafer W1.

In this condition, polishing is performed by sliding the large-diameter unit polishing cloth 140b from the outer edge of the semiconductor wafer W1 toward the center along the chamfers at the notch portion N, while supplying the polishing cloth 140 with polishing fluid and rotating the polishing drum 90A.

As a result, the chamfers can be polished to the inside of the notch portion N by contacting the outer edges of the large-diameter unit polishing cloth 140b having a large diameter with the chamfers of the notch portion N.

Additionally, by polishing the chamfers at portions aside from the notch portion N, it is possible to polish the chamfers over the entire circumference of a semiconductor wafer W1 containing a notch portion N using a single type of polishing drum 90A.

Furthermore, as shown in FIG. 16, the drum drive means 91 has a drum movement device 300 for advancing and retreating the polishing drum 90A along a line of contact with the notch portion N while the large-diameter unit polishing cloth 140b maintains contact with the notch portion N of the semiconductor wafer W1.

This drum movement device 300 moves the polishing drum 90A by a specified amount in the axial direction (contact direction) by means of the ball screw and servo motor in the drum direct drive unit 93 or the like.

Figure 17:
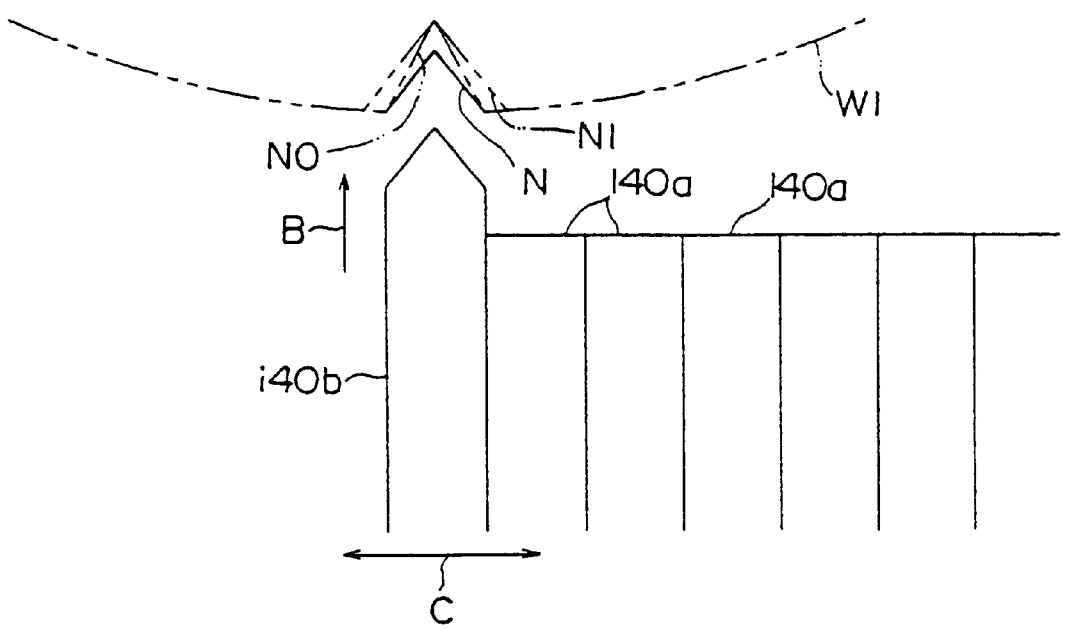
FIG. 17 is an enlarged section view showing a polishing cloth used for polishing the chamfers at a notched portion in a first embodiment of a semiconductor wafer chamfer polishing apparatus according to the present invention.

That is, if the outer edge of the large-diameter unit polishing cloth 140b is simply pressed in the radial direction of the semiconductor wafer W1 when polishing the notch portion N, the radial direction of the notch portion N is highly polished and it is difficult to uniformly polish the inside of the notch portion N as with the polishing surface N0 shown in FIG. 17.

Therefore, when polishing the notch portion N, the polishing drum 90A is rotated while maintaining a state of pressured contact in the radial direction (the direction of the arrow B in FIG. 17) between the outer edge of the large diameter unit polishing cloth 140b and the notch portion N. Then, the polishing drum 90A is repetitively advanced and retreated by a specified amount in the direction of contact, i.e., the axial direction of the polishing drum 90A (the direction of the arrow C in FIG. 17), by means of the drum movement device 300. As a result, a specific amount of pressure is applied not only in the radial direction but also in the circumferential direction of the inside of the notch portion N, so that the entire inside of the notch portion N is polished uniformly as with the polishing surface N1 shown in FIG. 17.

Additionally, with a conventional semiconductor wafer chamfer polishing apparatus, suction discs connected to suction means and the like are employed as means for holding the semiconductor wafers in a state of suction due to the low likelihood of damaging the front and reverse surfaces of the semiconductor wafer.

However, since these conventional semiconductor wafer chamfer polishing apparatus polish semiconductor wafers by pressing a polishing drum against one side of the semiconductor wafers from the outside in the radial direction, a pressing force is applied to the semiconductor wafers being held by the suction discs in a direction perpendicular to the chamfers, i.e., diagonal to the suction surface, which can result in the suction on the semiconductor wafers decreasing so that the semiconductor wafers may become mispositioned or dropped during polishing.

The semiconductor wafer chamfer polishing apparatus of the first embodiment has the object of performing excellent polishing while reliably holding semiconductor wafers.

With this semiconductor wafer chamfer polishing apparatus, the semiconductor wafers w are held from above by wafer suction discs 54, and the pair of polishing drums 90 contact the chamfers M on the bottom surfaces of the semiconductor wafers W and are positioned symmetrically-with respect to the axes of the semiconductor wafers W (i.e., at equivalent distances in the circumferential direction of the semiconductor wafers), so that the semiconductor wafers W are supported by the polishing cloths 111 on the pair of polishing drums 90 which contact the chamfers M on the bottom sides of the semiconductor wafers W during polishing.

That is, while the polishing cloths 111 each apply pressure to the chamfer M, they are positioned at equivalent distances in the circumferential direction of the semiconductor wafer W, thereby providing balance and mutually canceling the radial direction components of the pressing force so as to result in only components of the pressing force which are directed upward in the axial direction being applied to the semiconductor wafers W. That is, the pressing forces on the suction portions of the semiconductor wafers W during polishing are only applied perpendicular to the suction surfaces of the semiconductor wafers W (i.e. the suction direction), as a result of which the suction forces on the wafer suction discs 54 are sustained and reliably held by being pressed in the suction direction of the semiconductor wafers W.

Additionally, since the pair of polishing drums 90 are provided at equivalent distances in the circumferential direction of the semiconductor wafers W, the chamfers M around the entire circumference of the semiconductor wafers W can be polished by rotating the semiconductor wafers W until the chamfer M originally contacting one of the polishing cloths 111 is rotated into contact with the other polishing cloth 111. That is, there is no need to completely rotate the semiconductor wafers W, and the chamfers M can be completely polished over the entire circumference by rotating over only 180°.

Furthermore, since the pair of polishing drums 90 are rotated in the same direction with respect to the chamfers M, the components of friction in the radial direction of the semiconductor wafer W due to the sliding of the polishing cloths 111 over the chamfers M are mutually cancelled, so that only the components of friction in the axial direction of the semiconductor wafers are left. As a result, the suction force of the wafer suction discs 54 is maintained due to the friction applied to the suction portions of the semiconductor wafers W during polishing being applied perpendicular to the suction surface of the semiconductor wafer W.

Next, a second embodiment of a semiconductor wafer chamfer polishing apparatus according to the present invention shall be explained with reference to FIGS. 18 through 20.

In these drawings, reference numerals 130A and 130B denote polishing drums.

Figure 18:
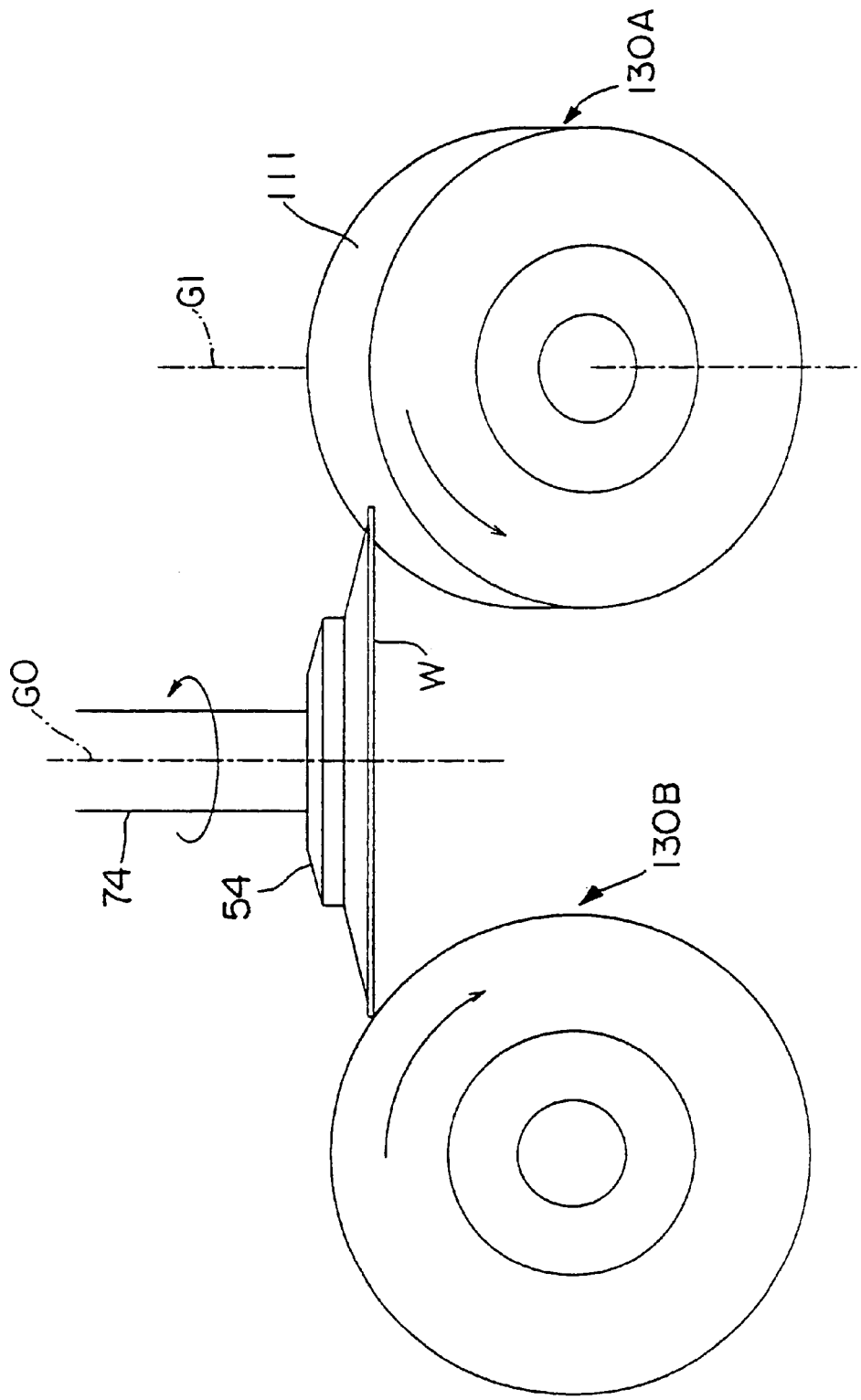
FIG. 18 is a simplified front view showing the positioning of a held semiconductor wafer and both polishing drums in a second embodiment of a semiconductor wafer chamfer polishing apparatus according to the present invention.
Figure 19:
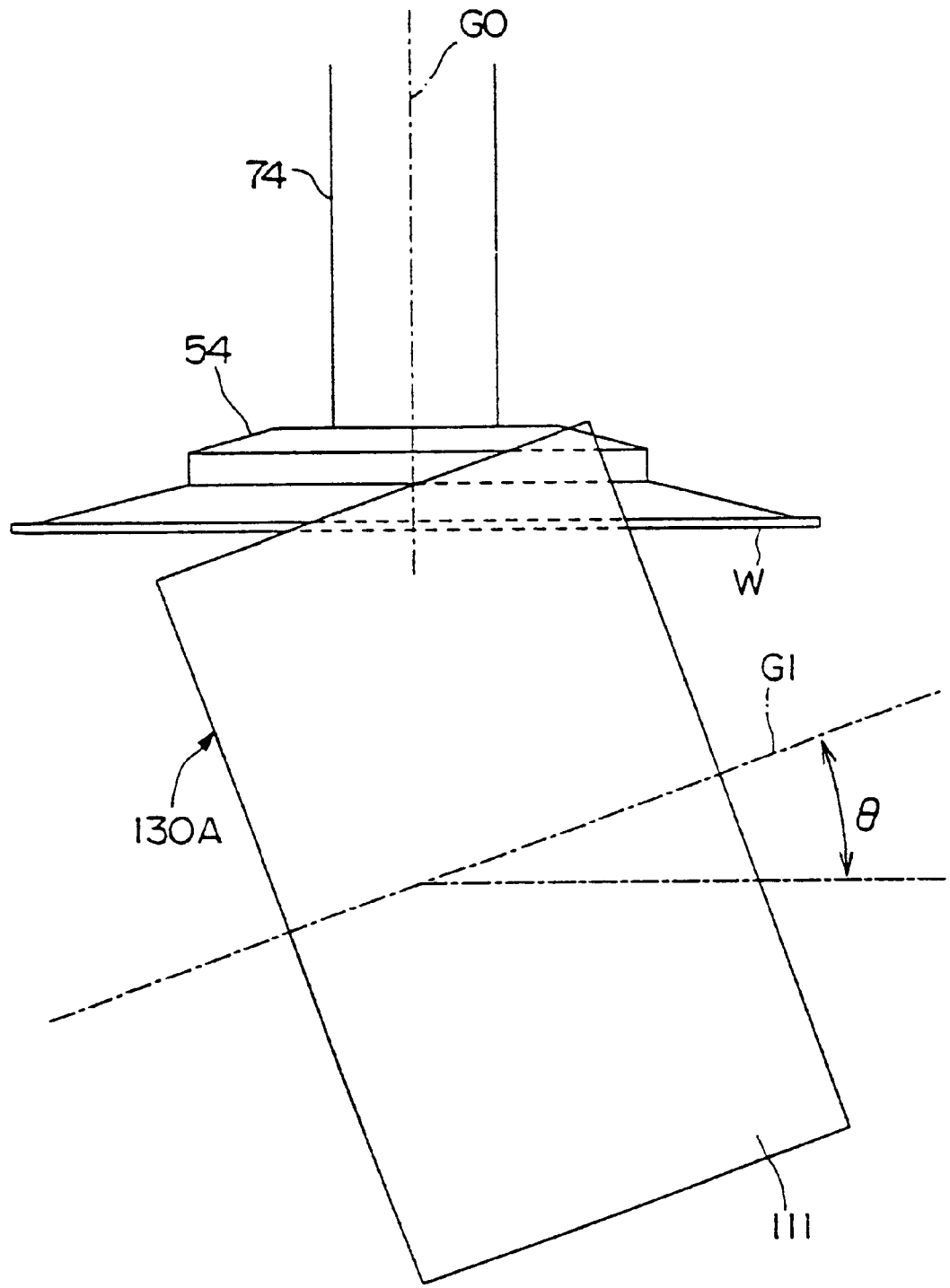
FIG. 19 is a simplified side view showing the positioning of a held semiconductor wafer and one of the polishing drums in a second embodiment of a semiconductor wafer chamfer polishing apparatus according to the present invention.
Figure 20:
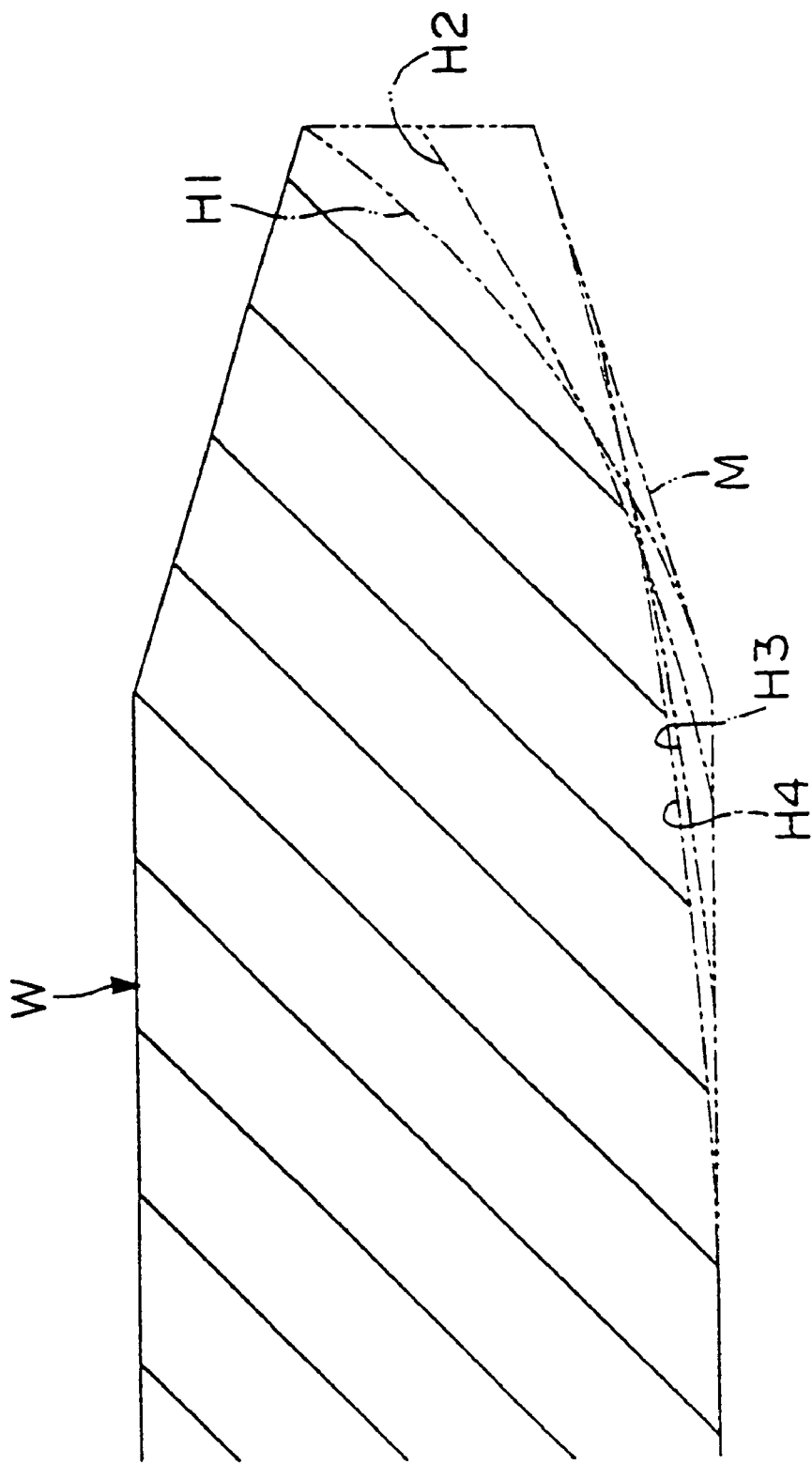
FIG. 20 is a simplified side view showing the state of contact of the chamfer of a semiconductor wafer and one of the polishing drums in a second embodiment of a semiconductor wafer chamfer polishing apparatus according to the present invention.

The second embodiment and first embodiment differ in that whereas the polishing drums 90 in the first embodiment are both positioned with their axes parallel to the front and reverse surfaces of the semiconductor wafers W, the polishing drums 130A and 130B in the second embodiment are oriented such that the axis G1 of one polishing drum 130A is tilted with respect to the front and reverse surfaces of the semiconductor wafers W and skewed with respect to the axes of the semiconductor wafers W, as shown in FIGS. 18 and 19.

That is, when polishing drums 90 with axes parallel to the front and reverse surfaces of the semiconductor wafers w are used as in the first embodiment, the position at which the polishing drum 130A contacts the chamfers M will not shift up or down, so that the pressing force onto the chamfers M must be increased to make the chamfers M push deeply into the polishing cloth 111 in order to increase the polishing area of the chamfers M. However, in this case, although the area of contact between the polishing cloth 111 and the chamfers M increases, the load on the semiconductor wafers W increases.

In contrast, with the semiconductor wafer chamfer polishing apparatus of the second embodiment, one of the polishing drums 130A of the two polishing drums 130A and 130B has an axis G1 which is tilted with respect to the front and reverse surfaces of the semiconductor wafers W and oriented such as to be skewed with respect to the axes G1 of the semiconductor wafers W. Consequently, the rotation of the semiconductor wafers W causes the position of contact of the polishing drum 130A on the chamfers M of the semiconductor wafers W to gradually shift in a vertical direction.

That is, the surface of the polishing drum 130A which contacts the chamfer M gradually moves downward from point H1 to point H4, so that the chamfer M is polished from top to bottom.

Consequently, with the semiconductor wafer chamfer polishing apparatus of the second embodiment, the polishing area in the vertical direction of the chamfers M can be increased with a small pressing force relative to that of the first embodiment, and the chamfers M can be polished into smooth curves.

In the present embodiment, the angle of tilt θ between the axis G1 of the polishing drum 130A and the front and reverse surfaces of the semiconductor wafer W is set to within the range of 5–20°, as shown in FIG. 19.

Next, a third embodiment of a semiconductor wafer chamfer polishing apparatus according to the present invention shall be explained with reference to FIGS. 21 through 23.

Conventional semiconductor wafer chamfer polishing apparatuses also have the following problem. That is, while the polishing fluid supplied to the polishing cloths must be held in the polishing cloths as much as possible in order to achieve good polishing performance, a large supply is required because it can drip or splatter due to its own weight or the rotation of the polishing drums. Additionally, in order to increase the mass productivity, the amount of time required to polish a single wafer must be shortened.

The semiconductor wafer chamfer polishing apparatus of the third embodiment has the object of increasing the polishing fluid retaining ability of the polishing cloths and shortening the polishing time.

Figure 21:
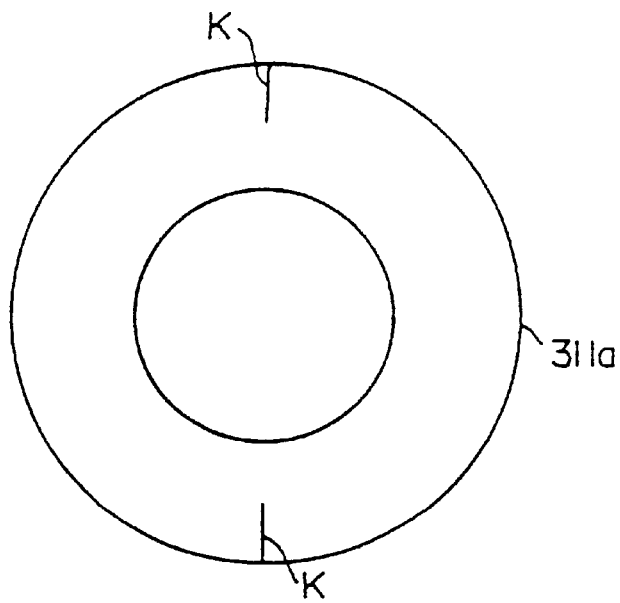
FIG. 21 is a side view showing a unit polishing cloth third embodiment of a semiconductor wafer chamfer polishing apparatus according to the present invention.

As shown in FIG. 21, the unit polishing cloths 311a of the third embodiment have cut portions K formed in the direction (axial directions of the polishing drums 90) of intersection with the circumferential direction on their outer circumferences.

The cut portions K are provided at two locations positioned symmetrically with respect to the center of each unit polishing cloth 311a, i.e., separated by the equivalent amounts of 180° in the circumferential direction. The depths of the cut portions K are chosen as appropriate to the polishing conditions.

Figure 22:
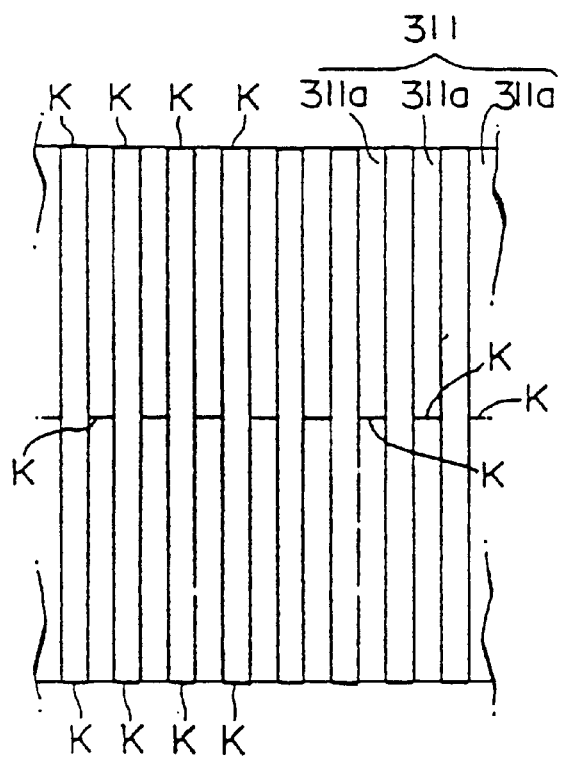
FIG. 22 is a plan view showing a portion of a polishing cloth in a third embodiment of a semiconductor chamfer polishing apparatus according to the present invention.

As shown in FIG. 22, the polishing cloth 311 is composed such that the cut portions K of adjacent unit polishing cloths 311a are mutually separated by 90° in the circumferential direction.

Figure 23:
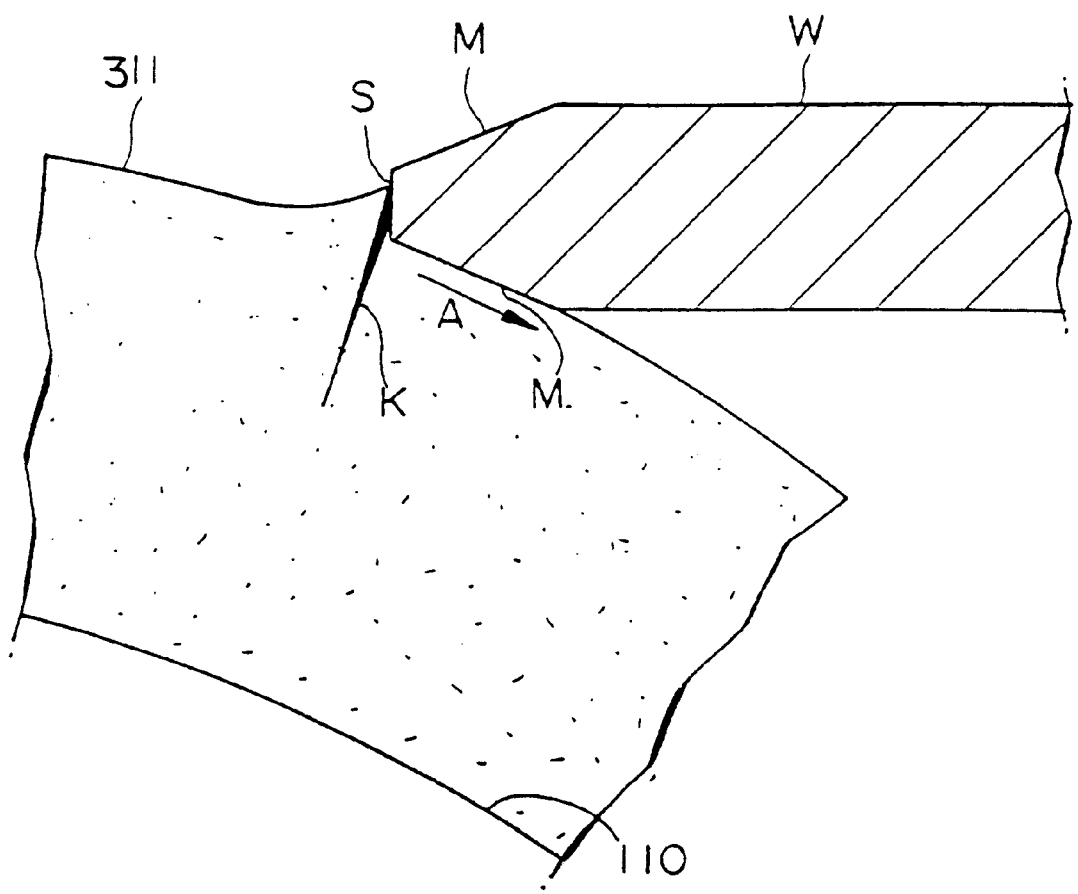
FIG. 23 is an enlarged vertical section view showing a portion of an enlarged vertical section view showing a cut portion for explaining the polishing of chamfers in a third embodiment of a semiconductor wafer chamfer polishing apparatus according to the present invention.

When compared to portions which do not have cut portions K at the portions with the cut portions K, the semiconductor wafers W are polished with the outer circumferential surfaces S and chamfers M pressing deeply into the polishing cloths 311 as shown in FIG. 23.

Since the semiconductor wafer chamfer polishing apparatus of the third embodiment has cut portions K in directions of intersection with the circumferential direction on the outer circumference of the polishing cloth 311, polishing fluid enters the cut portions K and is retained therein.

Additionally, the cut portions K contribute elasticity to their surroundings, so that when the polishing drum 90 is rotated, the edges (outer circumferential surface S and chamfers M) of the semiconductor wafer W tend to press into the polishing cloth 311 at the cut portions K and surroundings when compared to portions without cut portions K, so that the resistance with the chamfers M will increase and the polishing speed will become faster, thus allowing the polishing time to be shortened.

Furthermore, since the cut portions K on the polishing cloth 311 are provided at equivalent distances in the circumferential direction, the polishing ability of the polishing cloth 311 is made uniform in the circumferential direction and irregular wear in the circumferential direction is suppressed.

Additionally, since the polishing cloth 311 is composed of a plurality of annular unit polishing cloths 311a which are layered around the wheel main body 110, the depth, number and positions of the cut portions K can be arbitrarily set, so as to obtain various polishing properties by appropriately combining the plurality of unit polishing cloths 311a.

Furthermore, since the cut portions K of adjacent unit polishing cloths 311a in the polishing cloth 311 are arranged so as to be staggered in the circumferential direction, the cut portions K of adjacent unit polishing cloths 311a will not run together in the axial direction of the polishing drum 90, so that the amount of bite of the semiconductor wafers W is restricted and extraneous bite is prevented.

Figure 24:
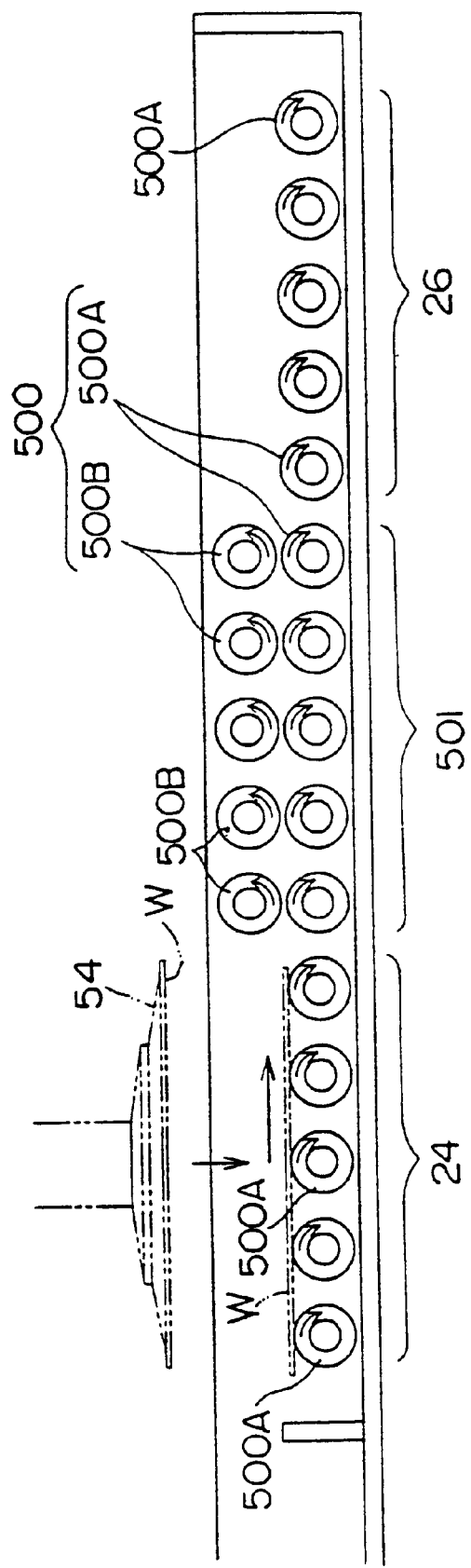
FIG. 24 is a simplified section view showing a third delivery section and a fourth delivery section of a fourth embodiment of a semiconductor wafer chamfer polishing apparatus according to the present invention.
Figure 25:
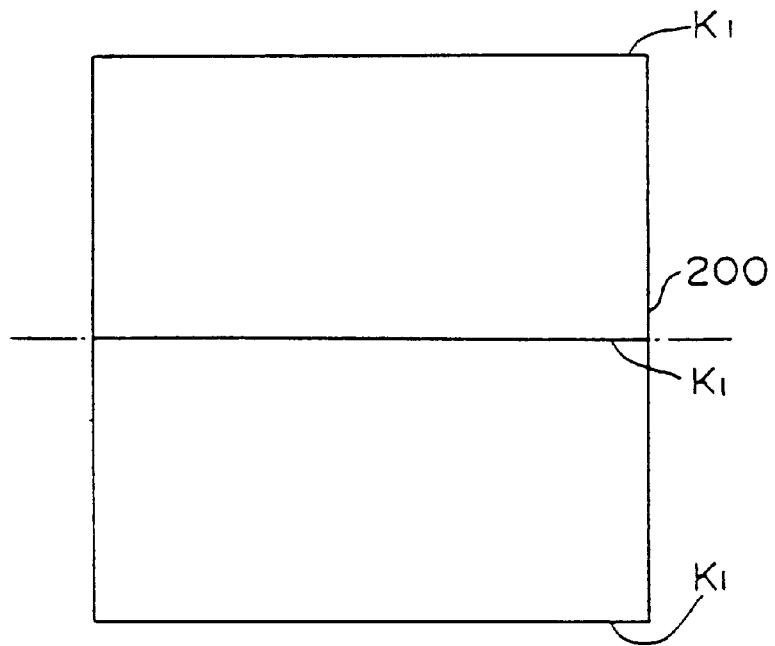
FIG. 25 is a plan view showing another example of a polishing cloth for a third embodiment of a semiconductor wafer chamfer polishing apparatus according to the present invention.
Figure 26:
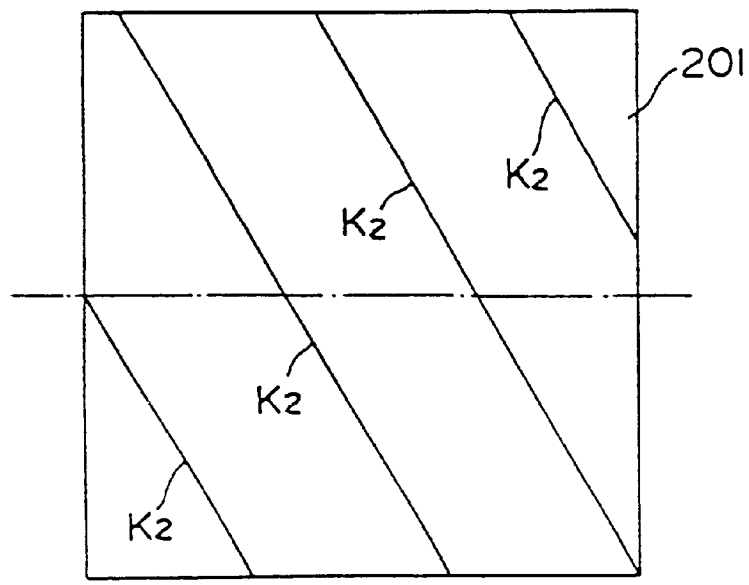
FIG. 26 is a plan view showing another example of a polishing cloth for a third embodiment of a semiconductor wafer chamfer polishing apparatus according to the present invention.

Next, a fourth embodiment of a semiconductor wafer chamfer polishing apparatus according to the present invention shall be explained with reference to FIG. 24.

The fourth embodiment differs from the first embodiment in that while the semiconductor wafers W in the first embodiment are conveyed through the water from the third delivery section 24 to the fourth delivery section 26 by placing them on a fourth hand 50 capable of horizontal movement, the semiconductor wafers in the fourth embodiment are conveyed through the water by means of a plurality of cleansing rollers 500 provided underwater from the third delivery section 24 to the fourth delivery section 26.

The cleansing rollers 500 are formed from tubular sponges or brushes, and comprise a plurality of bottom rollers 500A arranged in a row from the third delivery section 24 to the fourth delivery section 26 across the bottom of the water vat, and a plurality of top rollers 500B arranged in a row at an intermediary portion 501 between the third delivery section 24 and the fourth delivery section 26 at the top of the water vat.

The vertical positions of the bottom rollers 500A and the top rollers 500B are set such as to allow the semiconductor wafers W to pass between the bottom rollers 500A and the top rollers 500B while maintaining contact with the top rollers 500B.

These cleansing rollers 500 are oriented with their axes perpendicular to the direction of conveyance of the semiconductor wafers W and capable of rotating, with at least the bottom rollers 500A being rotationally driven by means of drive means such as motors which are not shown in the drawings.

That is, the semiconductor wafer chamfer polishing apparatus of the fourth embodiment conveys the semiconductor wafers W from the third delivery section 24 to the fourth delivery section 26 in the following manner.

First, the semiconductor wafers W with the reverse surfaces polished are placed onto the bottom rollers 500A of the third delivery section 24.

Subsequently, the placed semiconductor wafers W are moved through the water from the third delivery section 24 through the intermediary portion 501 to the fourth delivery section 26 by rotating the bottom rollers 500A. At this time, the semiconductor wafers W pass through the intermediary portion 501 while being pinched between the bottom rollers 500A and the top rollers 500B.

Then, the semiconductor wafers W which have been conveyed from the intermediary portion 501 to the bottom rollers 500A at the fourth delivery section 26 are transferred to the wafer storage device 10 as with the first embodiment.

Consequently, with this semiconductor wafer chamfer polishing apparatus, the semiconductor wafers W which have been polished are not simply conveyed through the water, but are conveyed while contacting the cleansing rollers 500 so that the sponges or brushes of the cleansing rollers 500 physically scrub the semiconductor wafers W to more effectively remove polishing fluid sticking to their surfaces.

The following embodiments are also included within the scope of the present invention.

(1) While the chamfers of the semiconductor wafers W are polished by a pair of polishing drums 90 in the above embodiments, there may be only a single polishing drum or many polishing drums. By providing as many polishing drums 90 as space allows, the amount of rotation of the semiconductor wafers can be made smaller so as to shorten the time required for polishing.

Specifically, while the semiconductor wafers W are polished by a pair of polishing drums 90 positioned symmetrically with respect to the axes of the semiconductor wafers W, it is possible to use three or more polishing drums as long as they are positioned at equivalent spacings in the circumferential direction of the semiconductor wafers. In this case, since the spacing between the polishing drums in the circumferential direction becomes smaller as the number of polishing drums increases, the rotational angle required in order to polish the chamfers around the entire circumference of the semiconductor wafers can be reduced so as to shorten the time required for the procedure.

(2) While the polishing cloth 111 of the first embodiment is formed by layering annular unit polishing cloths around the wheel main body 110 of a polishing drum 90, it is possible to have one attached by winding about the outer circumferential surface of a polishing drum 90.

(3) While the front surface and reverse surface of the semiconductor wafers are polished separately, it is possible to polish the chamfers on both surfaces simultaneously. In this case, polishing cloths must be provided at both the front surfaces and the reverse surfaces of the semiconductor wafers.

(4) While the polishing fluid is supplied to the polishing cloth 111 from above the polishing drum 90, it may be supplied by other means. For example, by providing through holes for supplying polishing fluid from inside the main body wheel to the outer circumferential surface and forming a plurality of lead holes extending from the inner circumferential surface in a radially outward direction of the polishing cloth, polishing fluid can be entered into the lead holes through the through holes from inside the main body wheel, so as to supply polishing fluid to the surface of the polishing cloth from between the unit polishing cloths by means of the centrifugal forces caused by rotation of the polishing drum.

(5) While the polishing drums 130A and 130B of the second embodiment are arranged such that only one of the polishing drums 130A has an axis G1 which is tilted with respect to the front and reverse surfaces of the semiconductor wafers W, it is possible to have both polishing drums 130A and 130B tilted in the same manner.

In the second embodiment, the reason that the other polishing drum 130B is oriented with the axis parallel to the front and reverse surfaces of the semiconductor wafers W as with the first embodiment is in order to polish the notch portions N of semiconductor wafers W1 having notch portions as shown in FIG. 14 by means of the other polishing drum 130B.

That is, as with the first embodiment, one or more unit polishing cloths corresponding to the shapes of the notch portions N and having diameters larger than the other unit polishing cloths can be attached to the other polishing drum 130B so as to allow polishing of the notch portions N by bringing these large diameter unit polishing cloths into contact with the notch portions N.

(6) While two cut portions K are formed in each of the unit polishing cloths 311a of the third embodiment, it is possible to form one or many cut portions.

Additionally, while the depths of the cut portions K are made identical, the depths of the cut portions can be set to individually differ.

Furthermore, while unit polishing cloths 311a all having identical cut portions K are used, it is possible to combine unit polishing cloths having different cut portions.

(7) While a polishing cloth 311 composed of a plurality of unit polishing cloths 311a is used in the third embodiment, it is possible to use a single thick polishing cloth 200 wound around the wheel main body (not shown in the drawings), with cut portions K1 formed on the outer circumference of the polishing cloth 200.

(8) While the cut portions K in the third embodiment are formed parallel to the axis of the polishing drum 90, it is possible to orient them in different directions as long as they intersect the circumferential direction. For example, the cut portions K2 may be formed diagonally with respect to the circumferential direction of the polishing cloth 201.

This type of cut portion K2 may be formed by a cutter or the like after a single thick polishing cloth 200 is wound, but the cut portions K2 may also be formed by winding a thin polishing cloth 201 diagonally around the wheel main body. In this case, the cut portions K2 are formed by the non-continuous portions of the polishing cloth 201, and the depths of the cuts are the same as the thickness of the polishing cloth 201.

Figure 27:
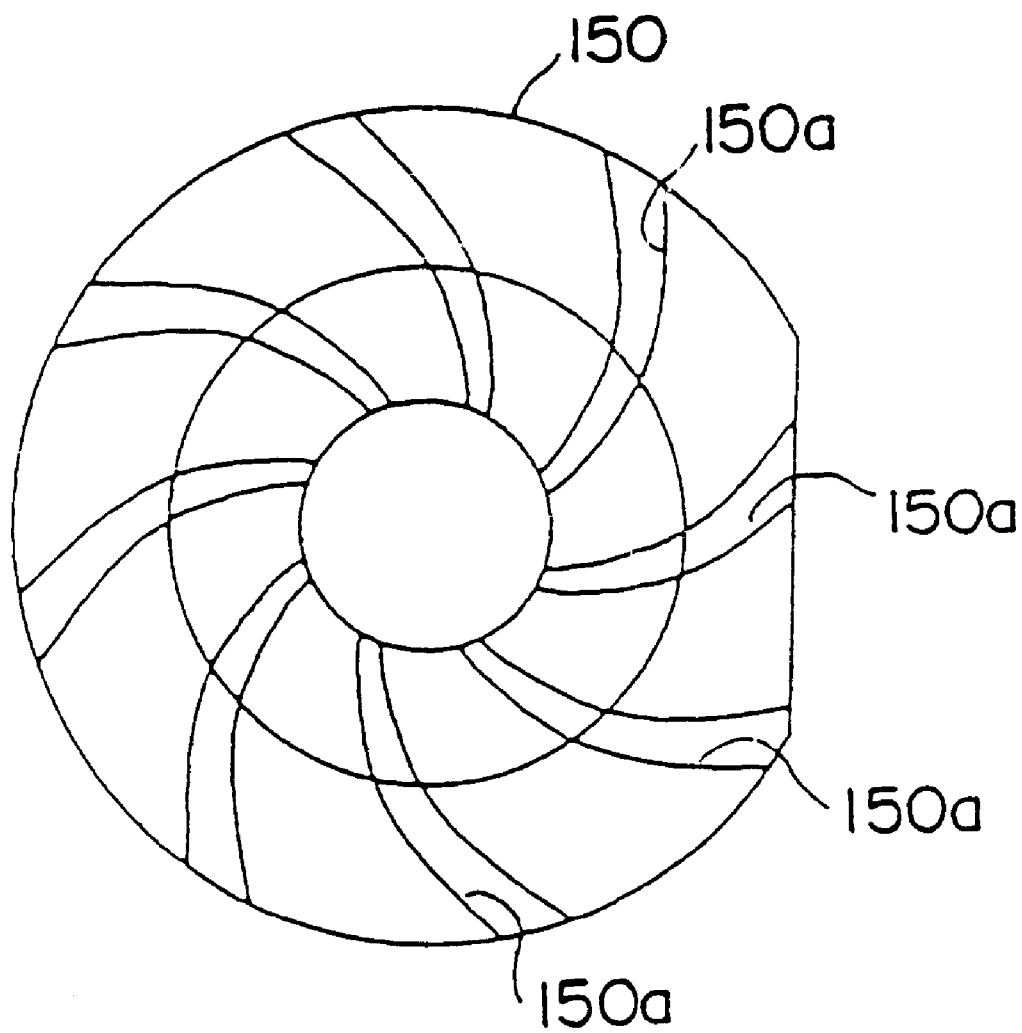
FIG. 27 is a plan view showing a wafer suction disc having spiral grooves of a first embodiment of a semiconductor wafer chamfer polishing apparatus according to the present invention.

(9) While the wafer suction discs 54 are formed in a roughly conical shape in order to increase the drainage of polishing fluid or cleansing water, the drainage can be further improved by using wafer suction discs 150 having a plurality of spiral grooves 150a extending from the center to the outer edge formed on the top surface, as shown in FIG. 27. That is, the polishing fluid on the rotating wafer suction discs 150 is led from the center to the outer edges along the spiral grooves 150a due to the centrifugal force so as to make it more likely to flow radially outward.

The present invention offers the following effects.

According to one embodiment of the semiconductor wafer chamfer polishing method and apparatus of the present invention, the direction of movement of the polishing cloth at the point of contact between the polishing cloth and the chamfers of the semiconductor wafers and the direction of movement of the chamfers of the semiconductor wafers are made to intersect perpendicularly by sliding the polishing cloth from the outer edges to the centers of the semiconductor wafers along the incline of the chamfers, thereby preventing the formation of ridges in the circumferential direction due to polishing, so as to form smooth chamfers, increase the processing precision of the semiconductor wafers, and suppress decreases in the throughput during production or the properties of the semiconductor wafers.

Furthermore, by contacting the polishing cloth with the chamfers while applying pressure such as to be elastically deformed while sliding, a bulge portion is formed on the polishing cloth contacting the outer side surfaces of the semiconductor wafers, so that the outer side surfaces are simultaneously polished along with the chamfers without forming ridges in the circumferential direction, thereby allowing the edges of the semiconductor wafer to be completely polished with high precision.

In this embodiment, due to the provision of a polishing drum having an outer circumferential surface covered by a polishing cloth on the polishing cloth drive device, when the polishing drum is brought into contact with the semiconductor wafers, polishing can be performed with the direction of rotation of the polishing drum and the direction of movement of the chamfers of the semiconductor wafers perpendicular, so as to allow the speed of the polishing cloth sliding on the chamfers to be easily adjusted by the rotational speed of the polishing drum.

Additionally, since the front surface polishing chamber and the reverse surface polishing chamber are separately provided with front surface side wafer cleansing section and a reverse surface side wafer cleansing section, each time the chamfers on the front surface side and the reverse surface side are polished, the semiconductor wafers are each immediately cleansed by the front surface side wafer cleansing section and the reverse surface side wafer cleansing section, contact marks for holding tools are not caused by polishing fluid remaining on the front and reverse surfaces so as to allow a high degree of flatness to be sustained and a high-quality semiconductor wafers to be produced.

Also, since a front surface polishing chamber and reverse surface polishing chamber are separately provided, they can perform polishing separately and in parallel, so that large amounts of semiconductor wafers can be continuously and efficiently polished in short periods of time by cleansing other semiconductor wafers in parallel at the front surface side wafer cleansing section and the reverse surface wide wafer cleansing section.

Furthermore, since the front surface polishing chamber and reverse surface polishing chamber are provided separately from the front surface side wafer cleansing section and the reverse surface side wafer cleansing section, intermixing between the polishing fluid and the cleansing water is reduced, so that they are both capable of being easily reused and it is possible to ensure a reduction of the running costs.

In this embodiment, the wafer conveyance device is provided with wafer flipping means, so that the front surface side and the reverse surface side of the semiconductor wafers being polished respectively in the front surface polishing chamber and the reverse surface polishing chamber are made to face in the same direction by means of the wafer flipping means, and the polishing of the front surface side and the reverse surface side can be performed by polishing devices of the same structure. Consequently, the polishing device can be made at a lower cost and the ease of maintenance can be increased. Additionally, since the top plates provided from the upper portions of the polishing chambers to the upper portions of the wafer cleansing sections are designed to become lower in steps from the polishing chambers to the wafer cleansing sections and store water on their top surfaces, polishing fluid dripping from the semiconductor wafers being transferred are caught in the water on the roof plates so as not to become dried, and is allowed to drain from the upper portions of the polishing chambers to the upper portions of the wafer cleansing sections in steps.

Consequently, it is possible to prevent accidents which may occur when polishing fluid adheres to other parts and dries, and to efficiently recover the polishing fluid which has dripped.

Additionally, since the polishing cloths are formed by layering a plurality of unit polishing cloths around the main body wheels, it is possible to easily and reliably form annular polishing cloths on the polishing drums simply by layering a plurality of unit polishing cloths around the main body wheels, thereby allowing the installation time to be shortened.

Also, since there are no seams in the polishing cloths formed by annular unit polishing cloths, peeling will not occur and it becomes less likely for damage to be caused to the semiconductor wafers, thus allowing good polishing properties to be obtained and suppressing the degradation of semiconductor properties.

Furthermore, since the thicknesses of the polishing cloths can be set by the inner diameters and outer diameters of the unit polishing cloths and this allows a specific elasticity to be obtained, the elasticity of the polishing cloths can be changed according to the size and material of the semiconductor wafers.

Additionally, even if the quality of the polishing cloth surface is reduced by wear, a new polishing cloth surface can be exposed by scraping away the surface, so that the polishing cloths can be used for long periods of time without replacing the polishing cloths, and a reduction of the frequency of replacement and an elongation of the lifespan of the polishing cloths can be ensured.

In this embodiment, the unit polishing cloths are formed from unwoven fabric and the fibers of the unit polishing cloths are arranged in random orientations, so that good polishing properties can be obtained no matter whether the front or reverse surface on the outer circumference and the area around the outer circumference of the unit polishing cloths contacts the chamfers.

Also, since annular reinforcement plates having higher rigidity than the polishing cloths are provided at both ends in the axial direction of the polishing cloths, the unit polishing cloths are prevented from spreading in the axial direction, separating from each other or bending, so that the polishing capabilities on the ends of the polishing drums in the axial direction are just as good as in the middle. Therefore, uniform polishing capabilities are able to be obtained over the entire polishing drums.

Additionally, annular presser plates which sandwich the polishing cloths which apply pressure to the polishing cloths are provided on both ends in the axial direction, so that the elasticities of the polishing cloths which are elastic bodies can be adjusted by compressing by a specified amount in the axial direction in accordance with the size and material of the semiconductor wafers.

Furthermore, since the unit polishing cloths in one portion are designed to have outer diameters which are larger than the other unit polishing cloths, as a result of which the outer edges of the unit polishing cloths with larger diameters can be brought into contact with the chamfers on the notch portions of semiconductor wafers so as to easily allow the chamfers to be polished to the insides of the notch portions.

Additionally, by polishing the chamfers at portions other than the notch portion with the unit polishing cloths at other portions, there is no need to prepare polishing drums especially for the notch portions, and the chamfers on the entire circumference of the semiconductor wafers including the notch portions can be polished by a single type of polishing drum so as to allow for the number of parts to be reduced.

Also, since a drum drive means has a drum movement device for advancing and retreating the portion of contact of the polishing drum with the semiconductor wafers, the entire inside portions of the notch portions can be polished evenly by contacting the outer circumferences of the unit polishing cloths having larger outer diameters with the notch portions while advancing or retreating the polishing drums in the axial direction by means of the drum movement device.

Furthermore, since the semiconductor wafers are held from above by means of wafer suction discs, the plurality of polishing cloths on the polishing cloth drive device are contacted with the chamfers on the bottom sides of the semiconductor wafers and are arranged at equivalent spacings in the circumferential direction of the semiconductor wafers, the pressing force on the semiconductor wafers becomes only the components which are applied perpendicularly to the suction surfaces of the semiconductor wafers, thereby allowing the suction force on the wafer suction discs to be well maintained, and allowing the semiconductor wafers to be reliably held with the pressing force being applied in the suction direction. Consequently, the semiconductor wafers will not shift from their positions during polishing, so as to allow polishing at a high degree of precision.

Additionally, since the polishing cloths are provided at equivalent spacings in the circumferential direction, there is no need to have them complete a circuit around the semiconductor wafers; the chamfers on the entire circumferences of the semiconductor wafers can be polished simply by rotating the semiconductor wafers by a rotational angle corresponding to the angle between the polishing cloths, thus allowing the processing time to be shortened.

In this embodiment, the frictional forces caused by the sliding of the polishing cloths on the chamfers become only the components which are applied perpendicular to the suction surfaces of the semiconductor wafers since the plurality of the polishing drums are rotated in the same direction with respect to the chamfers, thus allowing the suction forces of the wafer suction discs to be maintained.

Additionally, at least one of the plurality of polishing drums has an axis which is tilted with respect to the front and reverse surfaces of the semiconductor wafers and skewed with respect to the axes of, the semiconductor wafers, as a result of which the position of contact of the polishing drum on the chamfers of the semiconductor wafers gradually slides in a vertical direction so that the polishing area in the vertical direction of the chamfers can be enlarged even with a relatively small pressing force, and the chamfers can be polished into smoother curved surfaces.

Also, since the polishing cloths have cut portions formed in directions intersecting the circumferential directions on their outer circumferences, polishing fluid can enter and be held in the cut portions, as a result of which good polishing properties can be obtained and the supply of polishing fluid can be reduced.

Additionally, since the edges of the semiconductor wafers easily bite into the polishing cloths at and near the cut portions, the resistance increases so that the polishing speed becomes faster and the polishing time can be shortened, thus increasing the mass productivity.

In this embodiment, since the polishing cloths are formed from a plurality of annular unit polishing cloths which are layered around the wheel main body, the depths, number and position of the cut portions can be set for each unit polishing cloth, so as to allow various polishing capabilities to be obtained by appropriate combinations of the plurality of unit polishing cloths.

Additionally, annular polishing cloths can be easily and reliably formed on polishing drums by layering a plurality of unit polishing cloths around the wheel main body, thus allowing the installation time to be shortened.

Furthermore, peeling will not occur because there are no seams in the polishing cloths formed by annular unit polishing cloths.

Moreover, the thicknesses of the polishing cloths can be set by the inner diameters and outer diameters of the unit polishing cloths, and a specified elasticity can be obtained by this setting, so that the elasticity of the polishing cloths can be changed in accordance with the sizes and materials of the semiconductor wafers.

Additionally, even if the quality of the surfaces of the polishing cloths decrease due to wear, new polishing cloth surfaces can be exposed by scraping away the surfaces, so that the polishing cloths can be used for long periods of time without replacement, thus ensuring reductions in the frequency of replacement and elongation of the life span of the polishing cloths.

Furthermore, since the cut positions of adjacent polishing cloths are arranged so as to be mutually separated in the circumferential direction, the cut portions are not continuous in the axial directions of the polishing drums, thus allowing the amount of bite of the semiconductor wafers to be controlled and preventing extraneous amounts of bite. As a result, increases in the resistance due to bite can be set to appropriate levels, and large loads can be prevented from being applied to the semiconductor wafers due to bite.

Additionally, since the plurality of cut portions are arranged at equivalent spacings in the circumferential direction of the polishing cloths, the polishing characteristics in the circumferential direction are made uniform and uneven wear is controlled, thus ensuring a long life for the polishing cloths.

What is claimed as new and is desired to be secured by Letters Patent of the United States is:

1. A semiconductor wafer chamfer polishing method for polishing chamfers formed on the edges of semiconductor wafers, comprising the steps of:
    rotating a semiconductor having a chamfer;
    pressing a polishing cloth against the chamfer of the semiconductor wafer with sufficient pressure to elastically deform said polishing cloth while supplying polishing fluid to said chamfer; and
    sliding said polishing cloth along an incline of the chamfer from an outer edge toward a center of the semiconductor wafer, so as to form a bulge portion of said polishing cloth which contacts an outer surface of the semiconductor wafer, thereby polishing said outer surface together with the chamfer of the semiconductor wafer.

2. A semiconductor wafer chamfer polishing apparatus for polishing chamfers formed on the edges of semiconductor wafers, comprising:
    a wafer rotation mechanism for holding and rotating a semiconductor wafer; and
    a polishing cloth drive mechanism for pressing a polishing cloth against a chamfer of a semiconductor wafer held by the wafer rotation mechanism with sufficient pressure to elastically deform the polishing cloth while supplying polishing fluid to the chamfer, and for causing the polishing cloth to slide along an incline of the chamfer from an outer edge toward a center of the semiconductor wafer.

3. A semiconductor wafer chamfer polishing apparatus in accordance with claim 2, wherein said polishing cloth drive mechanism comprises a rotatably supported polishing drum having an axis parallel to front and reverse surfaces of a semiconductor wafer held on said wafer rotation mechanism, and drum drive means for rotating said polishing drum, wherein said polishing cloth covers an outer circumferential surface of said polishing drum.

4. A semiconductor wafer chamfer polishing apparatus in accordance with claim 2, further comprising:
    a wafer conveyance mechanism for conveying semiconductor wafers;
    a front surface polishing chamber and a reverse surface polishing chamber for polishing chamfers on a front surface side and a reverse surface side, respectively, of semiconductor wafers; and a front surface polishing chamber transfer mechanism and a reverse surface polishing chamber transfer mechanism for respectively transferring semiconductor wafers conveyed by said wafer conveyance mechanism to said front surface polishing chamber and said reverse surface polishing chamber, and for returning the semiconductor wafers to the wafer conveyance mechanism after the semiconductor wafers have been polished, wherein said wafer conveyance mechanism comprises a front surface side wafer cleansing portion and a reverse surface side wafer cleansing portion which cleanse each of the semiconductor wafers which are transferred from said front surface polishing chamber and said reverse surface polishing chamber by said front surface polishing chamber transfer mechanism and said reverse surface polishing chamber transfer mechanism with cleansing water.

5. A semiconductor wafer chamfer polishing apparatus in accordance with claim 4, wherein said wafer conveyance mechanism comprises wafer flipping means for receiving and flipping semiconductor wafers transferred from said front surface polishing chamber by said front surface polishing chamber transfer mechanism, then delivering the semiconductor wafers to said reverse surface polishing chamber transfer mechanism.

6. A semiconductor wafer chamfer polishing apparatus in accordance with claim 2, further comprising a polishing chamber for polishing chamfers of the semiconductor wafers;

a wafer cleansing portion for cleansing the semiconductor wafers with cleansing water after the semiconductor wafers have been polished in said polishing chamber;

a transfer mechanism for withdrawing the semiconductor wafers from said polishing chamber after the semiconductor wafers have been polished and moving the semiconductor wafers above said polishing chamber to transfer the semiconductor wafers to said wafer cleansing portion; and roof plates extending from a top portion of said polishing chamber to a top portion of said wafer cleansing portion, wherein said roof plates are designed to become lower in steps from said polishing chamber to said wafer cleansing portion, and have water stored on top surfaces thereof.

7. A semiconductor wafer chamfer polishing apparatus in accordance with claim 2, further comprising a polishing drum having a rotatably supported main body wheel wherein the polishing cloth is located around an outer circumferential surface of the main body wheel for polishing the chamfers by bringing the rotating polishing cloth into contact with the chamfers; and drum drive means for rotating said polishing drum, wherein said polishing cloth is formed into a cylindrical shape by layering a plurality of annular unit polishing cloths around said main body wheel.

8. A semiconductor wafer chamfer polishing apparatus in accordance with claim 7, wherein said unit polishing cloths are composed of unwoven fabrics with randomly oriented fibers.

9. A semiconductor wafer chamfer polishing apparatus in accordance with claim 7, wherein annular reinforcing plates having high rigidity for supporting said polishing cloth are provided on both axial ends of said cylindrical shaped polishing cloth.

10. A semiconductor wafer chamfer polishing apparatus in accordance with claim 7, including annular presser plates at both axial ends of said polishing cloth for applying pressure to sandwich said polishing cloth.

11. A semiconductor wafer chamfer polishing apparatus in accordance with claim 7, wherein outer diameters of said unit polishing cloths at one portion of the polishing cloth are larger than outer diameters of the other unit polishing cloths.

12. A semiconductor wafer chamfer polishing apparatus in accordance with claim 11, wherein said drum drive means is provided with a drum movement mechanism for advancing and retreating said polishing drum along a contact line of a contact portion of the semiconductor wafer with said polishing cloth contacting the circumferential edges of the semiconductor wafer.

13. A semiconductor wafer chamfer polishing apparatus in accordance with claim 2, wherein said wafer rotation mechanism is provided with a wafer suction disc which adheres to a top surface of the semiconductor wafer and supports the semiconductor wafer so as to be capable of rotating in a circumferential direction, and said polishing cloth drive mechanism comprises means for bringing said polishing cloth into contact with a chamfer on a bottom side of the semiconductor wafer, and has a plurality of polishing cloths positioned at equal spacings in a circumferential direction of the semiconductor wafer.

14. A semiconductor wafer chamfer polishing apparatus in accordance with claim 13, wherein said polishing cloth drive mechanism comprises a plurality of polishing drums provided with said polishing cloths on outer circumferential surfaces thereof, and rotatably supported with axes parallel to front and reverse surfaces of the semiconductor wafers; and a plurality of drum drive means for rotating said polishing drums in the same direction with respect to the chamfer.

15. A semiconductor wafer chamfer polishing apparatus in accordance with claim 13, wherein said polishing cloth drive mechanism comprises a plurality of rotatably supported polishing drums provided with said polishing cloths on outer circumferential surfaces thereof, and a plurality of drum drive means for rotating said polishing drums; and wherein at least one of said plurality of polishing drums is oriented such as to have an axis which is tilted with respect to front and reverse surfaces of the semiconductor wafers and skewed with respect to axes of the semiconductor wafers.

16. A semiconductor wafer chamfer polishing apparatus in accordance with claim 2, further comprising: a polishing drum having a rotatably supported main body wheel wherein the polishing cloth is located around an outer circumferential surface of the main body wheel for polishing the chamfers by bringing the rotating polishing cloth into contact with the chamfers; and drum drive means for rotating said polishing drum, wherein said polishing cloth has cut portions which intersect with a circumferential direction formed on an outer circumference thereof.

17. A semiconductor wafer chamfer polishing apparatus in accordance with claim 16, wherein said polishing cloth is arranged such that the plurality of cut portions are positioned at equal spacings in a circumferential direction.

18. A semiconductor wafer chamfer polishing apparatus in accordance with claim 16, wherein said polishing cloth is formed into a cylindrical shape by layering a plurality of annular unit polishing cloths around said main body wheel.

19. A semiconductor wafer chamfer polishing apparatus in accordance with claim 18, wherein said plurality of unit polishing cloths respectively have cut portions formed therein, and said polishing cloth is arranged such that the cut portions of adjacent unit polishing cloths are mutually separated in a circumferential direction of the cylindrical shape.

* * * * *

UNITED STATES PATENT AND TRADEMARK OFFICE
CERTIFICATE OF CORRECTION

PATENT NO. : 5,989,105

DATED : November 23, 1999

INVENTOR(S): Akira KAWAGUCHI et al.

It is certified that an error appears in the above-identified patent and that said Letters Patent is hereby corrected as shown below:

On the title page, item [75], the 1st Inventor's name is misspelled. The Inventors should read as follows:

--[75] Inventors: Akira Kawaguchi; Shigeru Kimura; Akihito Yanoo; Masao Takada, all of Hyogo-ken; Shoji Tsuruta; Shigeo Kumabe, both of Tokyo, all of Japan--

Signed and Sealed this

First Day of May, 2001

*Attest:*

NICHOLAS P. GODICI

*Attesting Officer*      *Acting Director of the United States Patent and Trademark Office*